(12) United States Patent
Akimoto

(10) Patent No.: US 8,395,201 B2
(45) Date of Patent: *Mar. 12, 2013

(54) NONVOLATILE SEMICONDUCTOR MEMORY DEVICE

(75) Inventor: Kengo Akimoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/288,995

(22) Filed: Nov. 4, 2011

(65) Prior Publication Data

US 2012/0043549 A1 Feb. 23, 2012

Related U.S. Application Data

(63) Continuation of application No. 12/861,977, filed on Aug. 24, 2010, now Pat. No. 8,072,017, which is a continuation of application No. 12/037,671, filed on Feb. 26, 2008, now Pat. No. 7,791,172.

(30) Foreign Application Priority Data

Mar. 19, 2007 (JP) ................................. 2007-070421

(51) Int. Cl.
*H01L 29/76* (2006.01)
(52) U.S. Cl. .. 257/314; 257/315; 257/347; 257/E21.179
(58) Field of Classification Search .................. 257/314, 257/315, 347, E21.179
See application file for complete search history.

(56) References Cited

U.S. PATENT DOCUMENTS

| 3,878,549 | A | 4/1975 | Yamazaki et al. |
| 5,132,754 | A | 7/1992 | Serikawa et al. |
| 5,248,630 | A | 9/1993 | Serikawa et al. |
| 6,653,699 | B1 | 11/2003 | Yang |
| 6,858,480 | B2 | 2/2005 | Nakamura et al. |
| 6,991,997 | B2 | 1/2006 | Takayama et al. |
| 7,115,453 | B2 | 10/2006 | Nakamura et al. |
| 7,135,736 | B2 * | 11/2006 | Nishikawa et al. ........... 257/316 |
| 7,316,947 | B2 | 1/2008 | Yamazaki et al. |
| 2005/0263767 | A1 | 12/2005 | Yamazaki et al. |
| 2005/0276115 | A1 | 12/2005 | Yamaguchi et al. |
| 2006/0118869 | A1 | 6/2006 | Lan et al. |
| 2006/0131636 | A1 | 6/2006 | Jeon et al. |
| 2006/0148216 | A1 | 7/2006 | Takayama et al. |
| 2007/0145458 | A1 | 6/2007 | Asami |

FOREIGN PATENT DOCUMENTS

| JP | 2006-013481 | 1/2006 |
| JP | 2006-032917 | 2/2006 |

* cited by examiner

*Primary Examiner* — Eugene Lee
(74) *Attorney, Agent, or Firm* — Nixon Peabody LLP; Jeffrey L. Costellia

(57) ABSTRACT

The invention relates to a nonvolatile semiconductor memory device including a semiconductor layer which has a source region, a drain region, and a channel forming region which is provided between the source region and the drain region; and a first insulating layer, a first gate electrode, a second insulating layer, and a second gate electrode which are layered over the semiconductor layer in that order. Part or all of the source and drain regions is formed using a metal silicide layer. The first gate electrode contains a noble gas element.

34 Claims, 23 Drawing Sheets

200

200

200

200

200

200

NONVOLATILE SEMICONDUCTOR MEMORY DEVICE

BACKGROUND OF THE INVENTION

1. Field of the Invention

The present invention relates to semiconductor devices having a memory element and methods of manufacturing semiconductor devices having a memory element.

Note that in the present invention, the term 'semiconductor device' refers to a device having a circuit which includes a semiconductor element (a transistor, a diode, or the like).

2. Description of the Related Art

In modern society, where many electronic devices are used, various data are generated and used, and memory elements (hereinafter also referred to as 'memories') are required to store the data. Various memories manufactured and used each have advantages and disadvantages, and are used appropriately depending on the type of data which is stored and used.

Memories can be broadly divided into two types; that is, volatile memories and nonvolatile memories. A volatile memory is a memory which loses stored data when the power is turned off, and a nonvolatile memory is a memory which retains stored data even when the power is turned off. Examples of volatile memories are dynamic random-access memories (DRAMs) and static random-access memories (SRAMs). The application of volatile memories is significantly limited because stored data is lost when the power is turned off; however, because the amount of time required for access is short, they are used for cache memories of computers and the like. Since a DRAM has small memory cells, a large-capacity DRAM can be easily produced. However, it is controlled in a complex manner and consumes a lot of power. An SRAM memory cell includes a CMOS transistor and is easily manufactured and controlled; however, since six transistors are necessary for one memory cell, it is difficult to obtain a large-capacity SRAM.

Nonvolatile memories, which retain their stored data even after the power is turned off, can be broadly divided into three types; that is, rewritable memories, write-once memories, and mask ROMs (read-only memories). Stored data can be rewritten many times, up to a certain limit, in rewritable memories. A user of a write-once memory can write data to the write-once memory only once. For a mask ROM, data content is determined at the time of manufacturing the memory, and cannot be rewritten.

Examples of rewritable nonvolatile memories are EPROMs, flash memories, ferroelectric memories, and the like. EPROMs allow easy writing of data and unit cost per bit is relatively low; however, they require a program device and an eraser dedicated to writing and erasing. In flash memories and ferroelectric memories, data can be rewritten on a substrate used. Flash memories and ferroelectric memories have short access time and low power consumption.

An example of a structure of a flash memory is a structure in which a tunnel insulating film, a floating gate, a gate insulating film, and a control gate are formed over an active layer.

Further, for such a flash memory, in order to increase response speed, scaling down design rules or forming silicide in a source region and a drain region of the active layer so that resistance of the source and drain regions themselves and contact resistance with a wiring are reduced can be considered. In order to form the silicide, a metal film formed of nickel (Ni), tungsten (W), titanium (Ti), cobalt (Co), or the like is used (refer to Patent Document 1: Japanese Published Patent Application No. 2006-13481 and Patent Document 2: Japanese Published Patent Application No. 2006-32917).

SUMMARY OF THE INVENTION

For the flash memory, subsequent to forming the silicide regions, there is a heating step in the manufacturing steps which lead to completion of the flash memory. Further, depending on the environment in which the flash memory is used, the flash memory may generate heat.

When there is a heating step in the manufacturing process for the flash memory or when the flash memory generates heat after it has been completed, the metallic element in the silicide region diffuses into a channel forming region, and degradation of characteristics caused by an increase in off-state current or the like occurs.

Therefore, an object of the present invention is to control degradation of characteristics of a memory transistor caused by a metallic element.

In the invention, a metallic element for forming a suicide region which has diffused into a channel forming region is moved from the channel forming region to a floating gate and absorbed by the floating gate, and thus, the concentration of the metal in the channel forming region can be reduced.

Specifically, when a semiconductor film to which a noble gas element has been added is used to form the floating gate, the metallic element is moved from the channel forming region to the floating gate. As a result, the concentration of the metallic element in the channel forming region decreases.

The invention relates to a nonvolatile semiconductor memory device, a memory element, and a method of manufacturing the nonvolatile semiconductor memory device and the memory element, which are described hereinafter.

The invention relates to a nonvolatile semiconductor memory device which includes a semiconductor layer having a source region, a drain region, and a channel forming region which is provided between the source region and the drain region; and a first insulating layer, a first gate electrode, a second insulating layer, and a second gate electrode which are layered in that order over the semiconductor layer. Part of the source region and the drain region or all of the source region and the drain region is formed using a silicide layer. The periphery of the first gate electrode is covered by an insulating film, and the first gate electrode contains a noble gas element.

The first gate electrode is formed of a semiconductor layer which contains an impurity element which imparts one conductivity type. The semiconductor layer contains the noble gas element.

The first gate electrode includes a first semiconductor layer containing an impurity element which imparts one conductivity type and a second semiconductor layer containing a noble gas element, which are stacked.

The concentration of the noble gas element is greater than or equal to $5.0 \times 10^{19}$ atoms/cm$^3$.

The noble gas is any one of argon, krypton, and xenon.

Further, the invention relates to a memory element including an island-shaped semiconductor film which is over an insulating surface and has a source region and a drain region, a channel forming region, and silicide regions which are formed in the source region and the drain region; a tunnel insulating film formed over the island-shaped semiconductor film; a floating gate which is over the tunnel insulating film and which is formed of a semiconductor film which contains a noble gas element; a gate insulating film formed over the floating gate; a control gate formed over the gate insulating film; sidewalls formed on side surfaces of the tunnel insulating film, the floating gate, the gate insulating film, and the control gate; an interlayer insulating film formed over the island-shaped semiconductor film, the sidewalls, and the control gate; and electrodes which are formed over the interlayer insulating film and which are electrically connected to the silicide regions.

In the invention, end portions of the source region and the drain region are in alignment with end portions of the control gate.

In the invention, end portions of the source region and the drain region are in alignment with end portions of the sidewalls.

The invention relates to a method of manufacturing a memory element in which an island-shaped semiconductor film is formed over a substrate; a tunnel insulating film is formed over the island-shaped semiconductor film; a floating gate is formed over the tunnel insulating film using a semiconductor film which contains a noble gas element; a gate insulating film is formed over the floating gate; a control gate is formed over the gate insulating film; an impurity element which imparts one conductivity type is added to the island-shaped semiconductor film, using the tunnel insulating film, the floating gate, the gate insulating film, and the control gate as a mask, to form a source region and a drain region; sidewalls are formed on side surfaces of the tunnel insulating film, the floating gate, the gate insulating film, and the control gate; a metal film is formed so as to cover the island-shaped semiconductor film, the sidewalls, and the control gate, and the metal film is heated to form silicide regions in the island-shaped semiconductor film; an unreacted region of the metal film is removed; an interlayer insulating film is formed so as to cover the island-shaped semiconductor film, the sidewalls, and the control gate; and wirings which are electrically connected to the silicide regions are formed over the interlayer insulating film.

The invention relates to a method of manufacturing a memory element in which an island-shaped semiconductor film is formed over a substrate; a tunnel insulating film is formed over the island-shaped semiconductor film; a floating gate is formed over the tunnel insulating film using a semiconductor film which contains a noble gas element; a gate insulating film is formed over the floating gate; a control gate is formed over the gate insulating film; sidewalls are formed on side surfaces of the tunnel insulating film, the floating gate, the gate insulating film, and the control gate; a metal film is formed so as to cover the island-shaped semiconductor film, the sidewalls, and the control gate, and the metal film is heated to form silicide regions in the island-shaped semiconductor film; an unreacted region of the metal film is removed; an impurity element which imparts one conductivity type is added to the island-shaped semiconductor film, using the sidewalls, the tunnel insulating film, the floating gate, the gate insulating film, and the control gate as a mask, and a source region and a drain region are formed; an interlayer insulating film is formed so as to cover the island-shaped semiconductor film, the sidewalls, and the control gate; and wirings which are electrically connected to the suicide regions are formed over the interlayer insulating film.

In the invention, the semiconductor film which contains a noble gas element is a silicon film which contains argon, and the concentration of the argon in the silicon film is greater than or equal to $5.0 \times 10^{19}$ atoms/cm$^3$.

According to the invention, because the silicide regions can be formed, response speed can be increased, and the metallic element concentration in the channel forming region can be reduced; therefore, a memory element with high reliability can be fabricated.

DETAILED DESCRIPTION OF THE INVENTION

Hereinafter, embodiment modes of the invention will be described with reference to the accompanying drawings.

However, the invention can be carried out in many different modes, and those skilled in the art will readily appreciate that a variety of modifications can be made to the modes and their details without departing from the spirit and scope of the invention. Accordingly, the invention should not be construed as being limited to the description of the embodiment modes.

Further, any of Embodiment Modes 1 to 4, which are described below, can be combined as appropriate to the extent that it is possible to combine them in implementing the invention.

[Embodiment Mode 1]

This embodiment mode will be described with reference to FIG. 1, FIGS. 2A to 2C, FIGS. 3A and 3B, FIGS. 4A to 4C, and FIG. 5.

Figure 1:
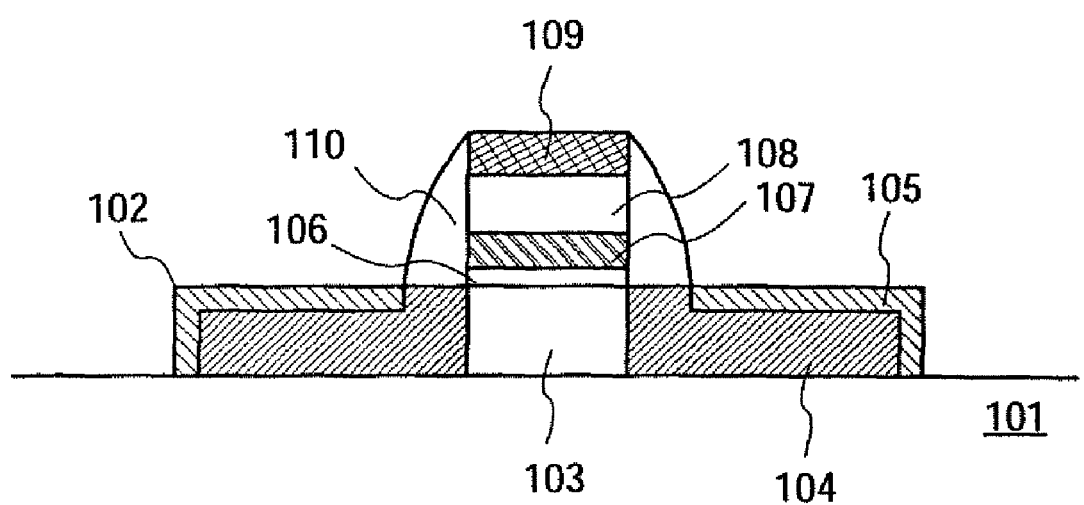
FIG. 1 is a cross-sectional view of a memory element in accordance with an embodiment mode of the invention.

FIG. 1 shows a cross-sectional structure of a memory element of this embodiment mode. An island-shaped semiconductor film 102 which is an active layer is formed over an insulating surface 101. A channel forming region 103; high-concentration impurity regions 104, which are each a source or drain region; and silicide regions 105, which are in upper portions of the high-concentration impurity regions 104, are formed in the island-shaped semiconductor film 102. The silicide regions 105 can be formed of, for example, nickel silicide. Alternatively, cobalt silicide, titanium silicide, tungsten silicide, or the like can be used as appropriate.

A tunnel insulating film 106, a floating gate 107, a gate insulating film 108, and a control gate 109 are formed over the channel forming region 103. Sidewalls 110 are formed on side surfaces of the tunnel insulating film 106, the floating gate 107, the gate insulating film 108, and the control gate 109.

The insulating surface 101 may be a substrate or an insulating film formed over a substrate, for example. As a substrate, a glass substrate, a plastic substrate, a silicon on insulator (SOI) substrate, or the like may be used. In the case of forming an insulating film over a substrate, as the insulating film, a silicon oxide film, a silicon nitride film, a silicon nitride film which contains oxygen, or a silicon oxide film which contains nitrogen may be used.

As the island-shaped semiconductor film 102 which is an active layer, silicon (Si) may be used. Further, silicon oxide may be used for the tunnel insulating film, and the tunnel insulating film has a thickness of less than or equal to 5 nm.

In the invention, a semiconductor film which contains a noble gas element is used as the floating gate 107. For example, a silicon (Si) film which contains argon (Ar) is used to form the floating gate 107. If the concentration of the noble gas element contained in the semiconductor film is too low, the effect of movement of and absorption of a metallic element (referred to as 'gettering' in this specification), which will be described later, cannot be obtained; therefore, a concentration which allows gettering to be performed is selected. For example, a silicon film in which the concentration of argon is greater than or equal to $5.0 \times 10^{19}$ atoms/cm$^3$ is formed by sputtering. In this embodiment mode, a silicon film in which the concentration is approximately $3.0 \times 10^{20}$ atoms/cm$^3$ is formed by sputtering, and is used to form the floating gate 107. Accordingly, nickel (Ni) which has diffused into the channel forming region 103 from the silicide regions 105 can be made to pass through the tunnel insulating film 106 and can be absorbed by the floating gate 107. Note that the noble gas element does not have to be argon. The noble gas element may be krypton or xenon.

After forming the floating gate 107, for example, when heat treatment is performed for four hours at 550° C., nickel contained in the channel forming region 103 moves to the floating gate 107. Then, for example, a pre-heat treatment nickel concentration of $1.0 \times 10^{13}$ atoms/cm$^2$ in the channel forming region 103 can be reduced such that after heat treatment is performed, when the surface concentration is measured by total reflection X-ray fluorescence spectroscopy (TXRF) it is found to be approximately $3.0 \times 10^{10}$ atoms/cm$^2$.

The gate insulating film 108 and the control gate 109 are formed over the floating gate 107.

The gate insulating film 108 may be formed using a silicon oxide film, a silicon nitride film, a silicon nitride film which contains oxygen, a silicon oxide film which contains nitrogen, or the like. The control gate 109 may be formed using tungsten (W), tantalum (Ta), titanium (Ti), aluminum (Al), or the like.

A method of manufacturing a memory element of this embodiment mode will now be described in detail.

Figure 2A:
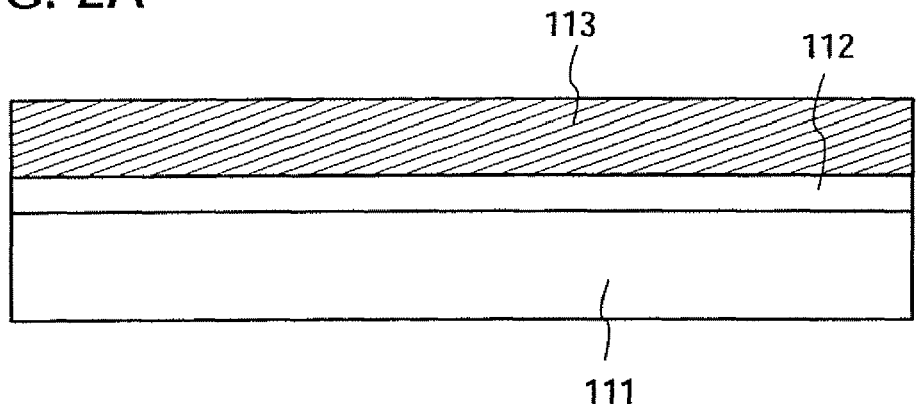
FIGS. 2A to 2C are cross-sectional views of manufacturing steps of a memory element in accordance with an embodiment mode of the invention.
Figure 2B:
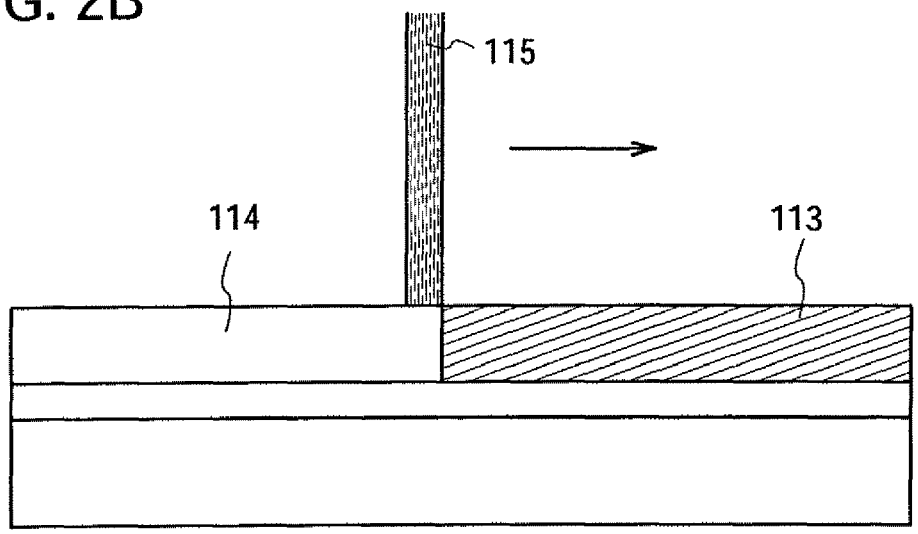

Over a substrate 111, a base film 112 is formed, and further, an amorphous semiconductor film 113 is formed (refer to FIG. 2A). As the substrate 111, a glass substrate, a quartz substrate, or the like may be used, for example. As the base film 112, a silicon oxide film, a silicon nitride film, a silicon nitride film which contains oxygen, a silicon oxide film which contains nitrogen, or a stacked film containing any of those films may be used. For example, a silicon oxide film with a thickness of 100 nm may be used. The amorphous semiconductor film 113 is formed to a thickness within the range of 20 to 150 nm. In this embodiment mode, an amorphous silicon film with a thickness of 60 nm is formed as the amorphous semiconductor film 113.

Next, the amorphous semiconductor film 113 is crystallized to form a crystalline semiconductor film 114. Crystallization may be performed by introducing an element that promotes crystallization and then performing heat treatment; or by irradiating with laser light. In this embodiment mode, the amorphous silicon film is crystallized by being irradiated with laser light 115 to form a crystalline silicon film—(refer to FIG. 2B).

Figure 2C:
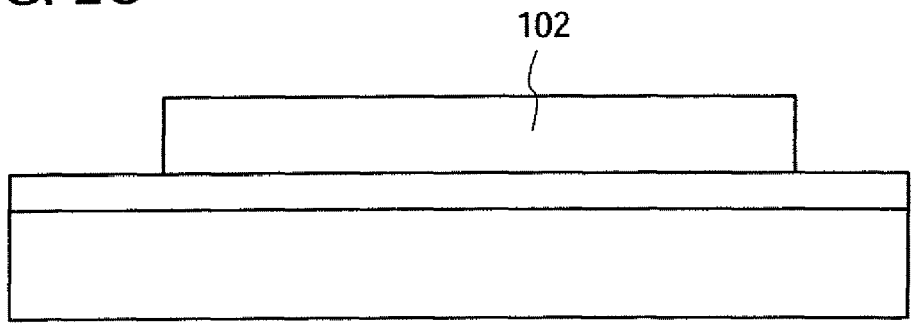

Then, the island-shaped semiconductor film 102 is formed using the obtained crystalline semiconductor film 114 (refer to FIG. 2C).

Figure 3A:
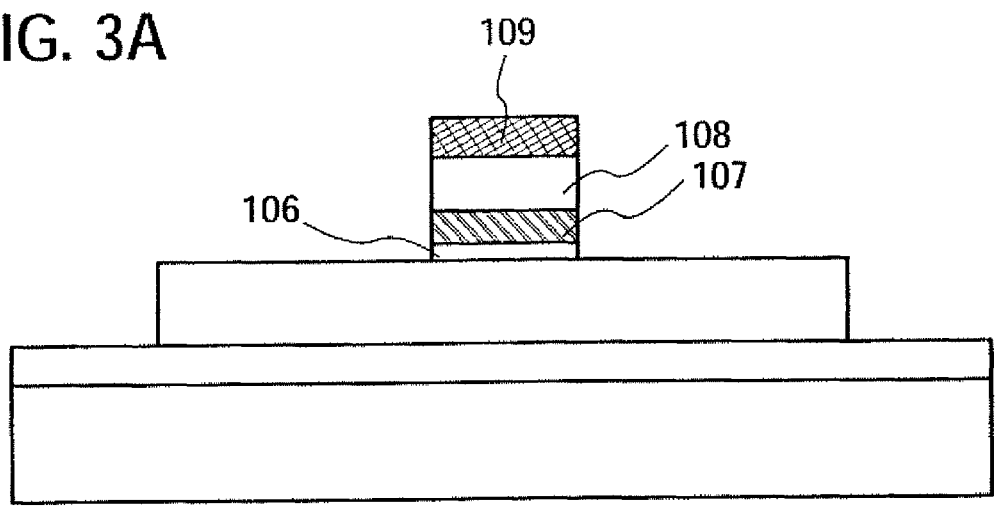
FIGS. 3A and 3B are cross-sectional views of manufacturing steps of a memory element in accordance with an embodiment mode of the invention.

Subsequent to forming the island-shaped semiconductor film 102, the tunnel insulating film (also referred to as a tunnel oxide film) 106 is formed to a thickness of less than or equal to 5 nm (refer to FIG. 3A). In this embodiment mode, the tunnel insulating film 106 is formed to a thickness of 2 to 3 nm.

Next, as the floating gate 107, a semiconductor film which contains a noble gas element is formed over the tunnel insulating film 106. In this embodiment mode, a silicon film which contains argon to a concentration of approximately one atomic percent is formed as the floating gate 107 by CVD or sputtering. An impurity element which imparts one conductivity type is added to the semiconductor film which is formed as the floating gate 107 while or after forming the semiconductor film.

Then, the gate insulating film 108 is formed over the floating gate 107 to a thickness of 10 to 100 nm, and the control gate 109 is formed over the gate insulating film 108 using a conductive film formed from Ta, W, or the like.

Figure 3B:
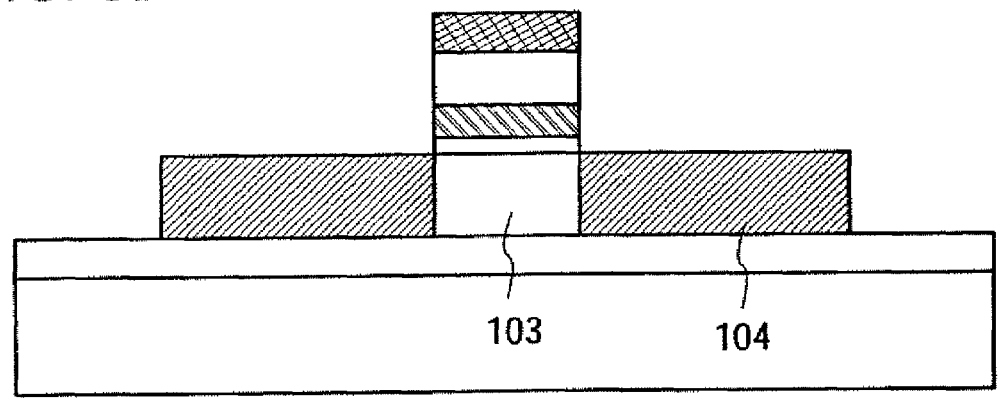

Next, an impurity element which imparts one conductivity type is added to the island-shaped semiconductor film 102, using the tunnel insulating film 106, the floating gate 107, the gate insulating film 108, and the control gate 109 as a mask; and thereby, the high-concentration impurity regions 104, which are each a source or drain region, and the channel forming region 103 are formed (refer to FIG. 3B). In this embodiment mode, phosphorus (P) is added by a doping technique using an accelerating voltage of 20 keV and a dosage of $1.0\times10^{15}$ atoms/cm$^2$. The concentration of phosphorus in the high-concentration impurity regions 104, which are each a source or drain region, is less than or equal to $3.0\times10^{21}$ atoms/cm$^3$. Note that because addition of the impurity element which imparts one conductivity type is performed using the tunnel insulating film 106, the floating gate 107, the gate insulating film 108, and the control gate 109 as a mask, end portions of each of the high-concentration impurity regions 104, which are each a source or drain region, are in alignment with end portions of the tunnel insulating film 106, the floating gate 107, the gate insulating film 108, and the control gate 109.

Subsequently, an insulating film is formed over the island-shaped semiconductor film 102, the tunnel insulating film 106, the floating gate 107, the gate insulating film 108, and the control gate 109; for example, a silicon oxide film which contains nitrogen is formed by CVD. The insulating film is anisotropically etched to form sidewalls 110 on side surfaces of the tunnel insulating film 106, the floating gate 107, the gate insulating film 108, and the control gate 109 (refer to FIG. 4A).

Figure 4A:
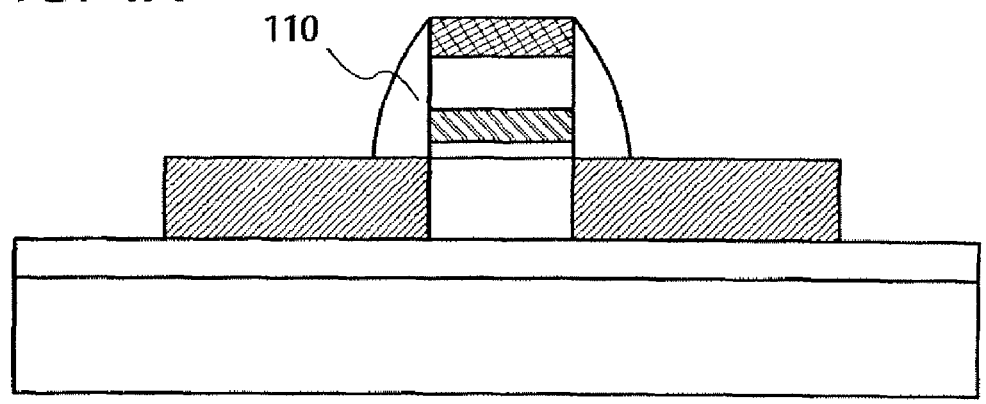
FIGS. 4A to 4C are cross-sectional views of manufacturing steps of a memory element in accordance with an embodiment mode of the invention.
Figure 4B:
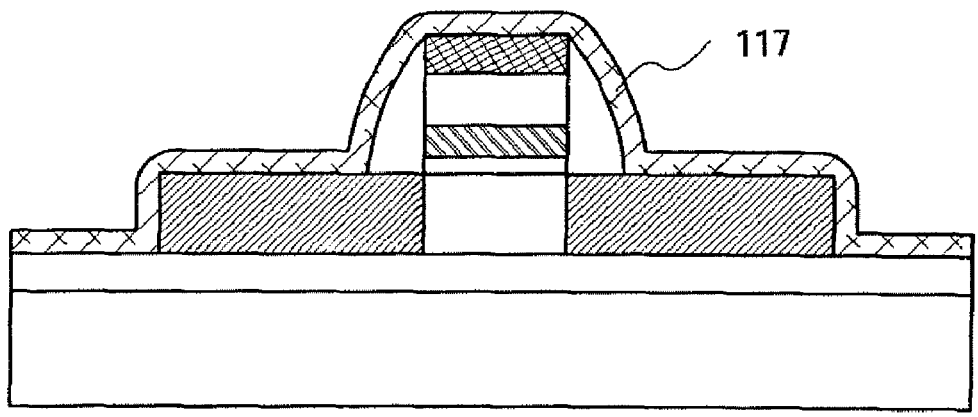

Next, in order to form silicide regions, a metal film 117 which covers the island-shaped semiconductor film 102, the sidewalls 110, and the control gate 109 is formed (refer to FIG. 4B). In this embodiment mode, a nickel film is formed over the island-shaped semiconductor film 102 to a thickness of 20 nm by sputtering.

Figure 4C:
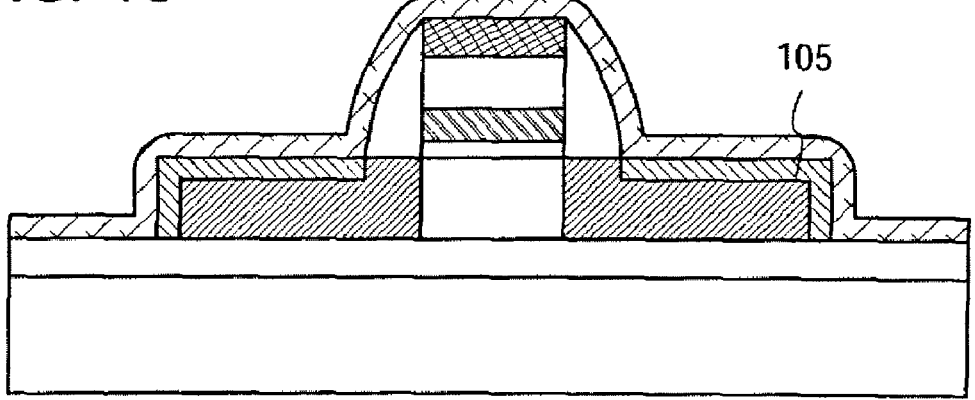

Subsequently, heat treatment is performed at a temperature of greater than or equal to 350° C. and silicide regions 105 are formed within each of the high-concentration impurity regions 104, which are each a source or drain region (refer to FIG. 4C). Next, an unreacted region of the metal film 117 is removed by etching using sulfuric acid, nitric acid, or the like (refer to FIG. 1). In this embodiment mode, because a nickel film is used as the metal film 117, nickel silicide regions are formed in the high-concentration impurity regions 104, which are each a source or drain region.

Note that even if a slight amount of residue remains after the unreacted region of the metal film 117 has been removed by etching, a short circuit between the control gate 109 and the island-shaped semiconductor film 102 can be prevented, because the sidewalls 110 have been formed.

Next, an interlayer insulating film 118 which covers the island-shaped semiconductor film 102, the sidewalls 110, and the control gate 109 is formed. Further, contact holes which reach the silicide regions 105 of the high-concentration impurity regions 104, which are each a source or drain region, are formed in the interlayer insulating film 118.

Figure 5:
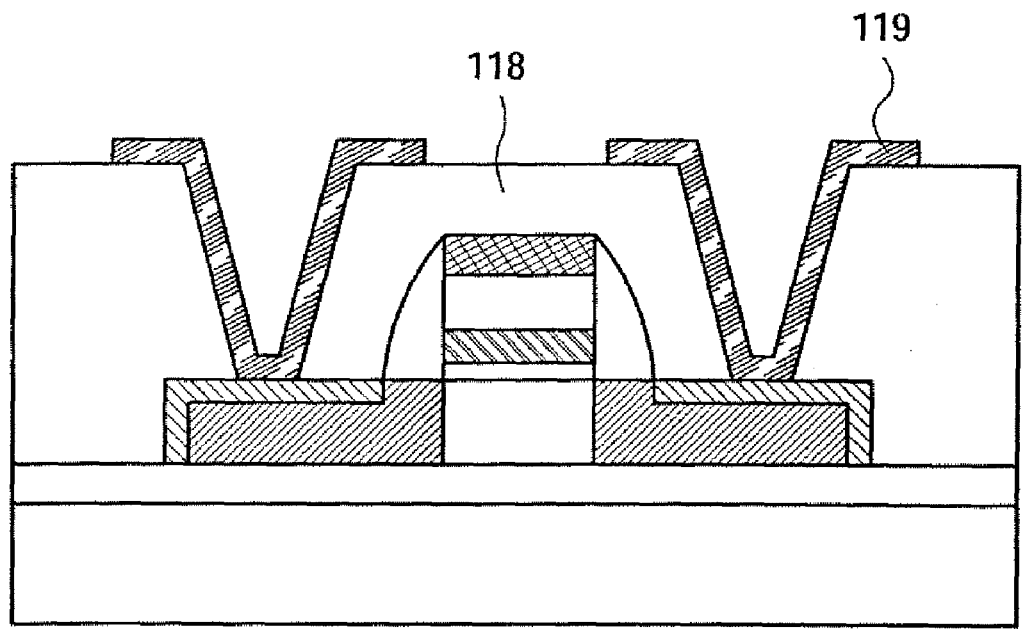
FIG. 5 is a cross-sectional view of a memory element in accordance with an embodiment mode of the invention.

Further, a conductive film is formed over the interlayer insulating film 118, and the conductive film is used to form wirings 119 which are electrically connected to the silicide regions 105 of the high-concentration impurity regions 104, which are each a source or drain region, via the contact holes in the interlayer insulating film 118, and thus, a memory element is formed (refer to FIG. 5). Even if the metallic element in the silicide regions 105 diffuses from the silicide regions 105 into the channel forming region 103 due to heat when the interlayer insulating film 118 is formed, because the metallic element is absorbed by the floating gate 107, an adverse effect on characteristics of the memory element can be suppressed.

[Embodiment Mode 2]

In this embodiment mode, a method of forming a memory element which differs from the method of Embodiment Mode 1 will be described with reference to FIGS. 6A to 6C and FIGS. 7A to 7C.

In Embodiment Mode 1, the silicide regions 105 are formed subsequent to adding the impurity element which imparts one conductivity type to the island-shaped semiconductor film 102 to form the high-concentration impurity regions 104 which are each a source or drain region.

This is because if the impurity element is added to the island-shaped semiconductor film to form the source and drain regions after the silicide regions have been formed, it is difficult to lower resistance.

However, the impurity element for forming the source and drain regions can be added after forming the silicide regions, as long as the level of resistance which the element is designed to have can be achieved sufficiently. A method for doing so will be described below. Note that unless otherwise specified, components correspond to those in Embodiment Mode 1.

First, process steps up to and including those for forming the control gate 109 shown in FIG. 3B are performed based on the description in Embodiment Mode 1. Next, an insulating film is formed; for example, a silicon oxide film which contains nitrogen is formed by CVD. The insulating film is then anisotropically etched to form the sidewalls 110 (refer to FIG. 6A).

Figure 6A:
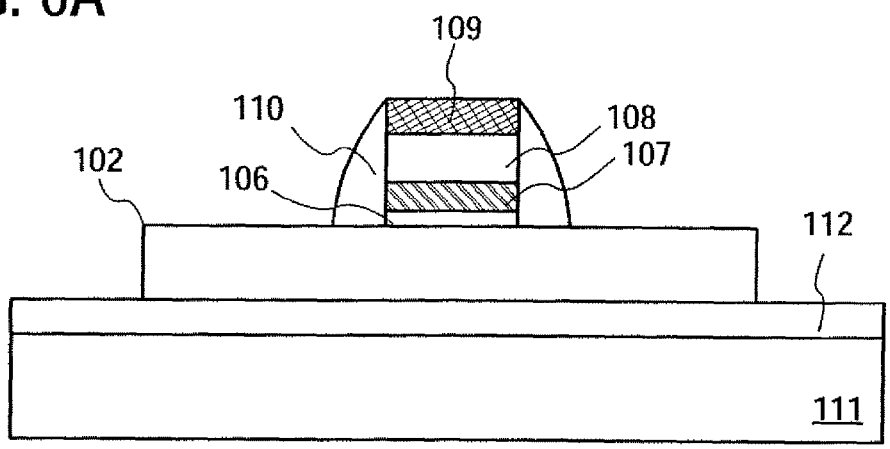
FIGS. 6A to 6C are cross-sectional views of manufacturing steps of a memory element in accordance with an embodiment mode of the invention.
Figure 6B:
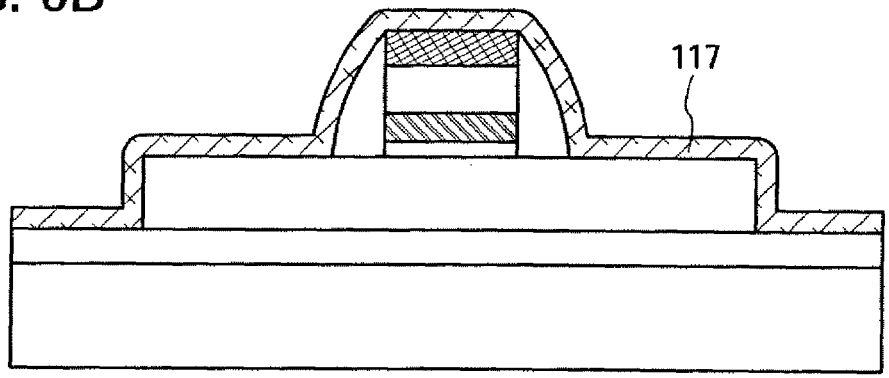

Then, the metal film 117 is formed so as to cover the island-shaped semiconductor film 102, the sidewalls 110, and the control gate 109 (refer to FIG. 6B).

Figure 6C:
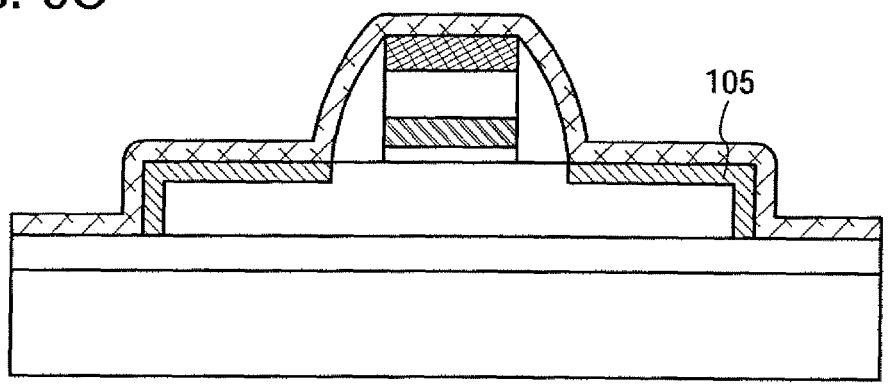

Subsequently, heat treatment is performed at a temperature of greater than or equal to 350° C., and the silicide regions 105 are formed in regions of the island-shaped semiconductor film 102 which are not covered by the sidewalls 110 or the tunnel insulating film 106 (refer to FIG. 6C). Next, an unreacted region of the metal film 117 is removed by etching using sulfuric acid, nitric acid, or the like (refer to FIG. 7A). In this embodiment mode, because a nickel film is used as the metal film 117, nickel silicide regions are formed in the island-shaped semiconductor film 102.

Figure 7A:
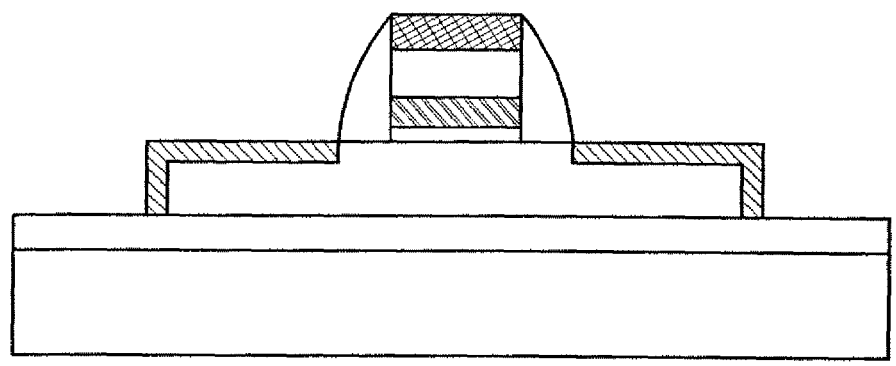
FIGS. 7A to 7C are cross-sectional views of manufacturing steps of a memory element in accordance with an embodiment mode of the invention.
Figure 7B:
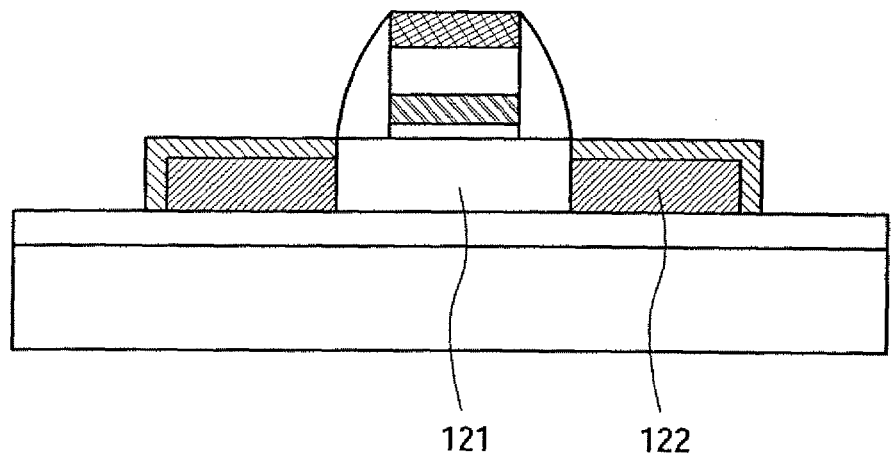

Then, an impurity element which imparts one conductivity type is added to the island-shaped semiconductor film 102, using the tunnel insulating film 106, the floating gate 107, the gate insulating film 108, the control gate 109, and the sidewalls 110 as a mask, and thereby source and drain regions 122 and a channel forming region 121 are formed (refer to FIG. 7B). In this embodiment mode, phosphorus (P) is added to the island-shaped semiconductor film 102 as the impurity element which imparts one conductivity type. Note that in this embodiment mode, the sidewalls 110 are included in the mask used when the impurity element which imparts one conductivity type is added, and in a mask for forming the silicide regions 105; therefore, end portions of each of the source and drain regions 122 are in alignment with end portions of the silicide regions 105.

Figure 7C:
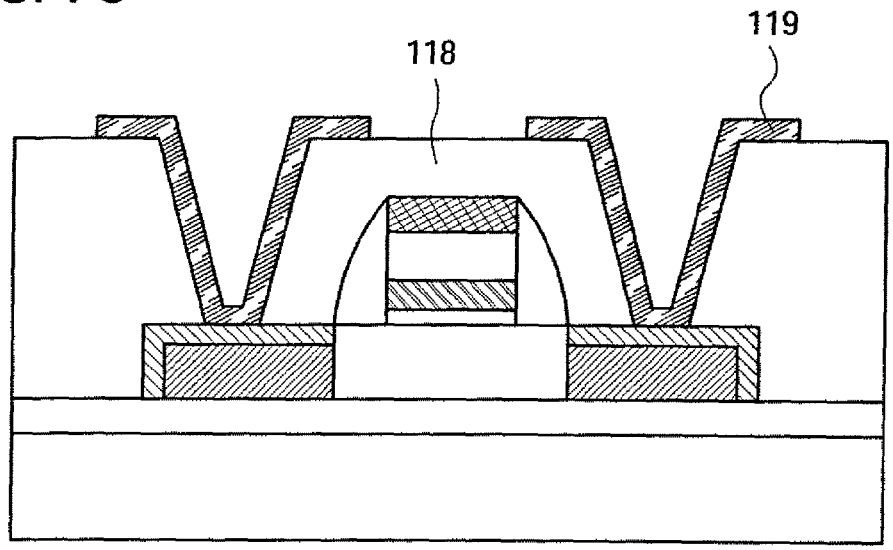

Next, the interlayer insulating film 118 is formed, and the wirings 119, which are electrically connected to the silicide regions 105 in the source and drain regions 122, are formed over the interlayer insulating film 118; and thus, a memory element is formed (refer to FIG. 7C). Even if the metallic element in the silicide regions 105 diffuses from the silicide regions 105 into the channel forming region 121 due to heat when the interlayer insulating film 118 is formed, because the metallic element is absorbed by the floating gate 107, an adverse effect on characteristics of the memory element can be suppressed.

[Embodiment Mode 3]

In this embodiment mode, a case where a memory element of the invention is used in a semiconductor device which is capable of wireless communication will be described with reference to FIGS. 8, 9A, and 9B.

Figure 8:
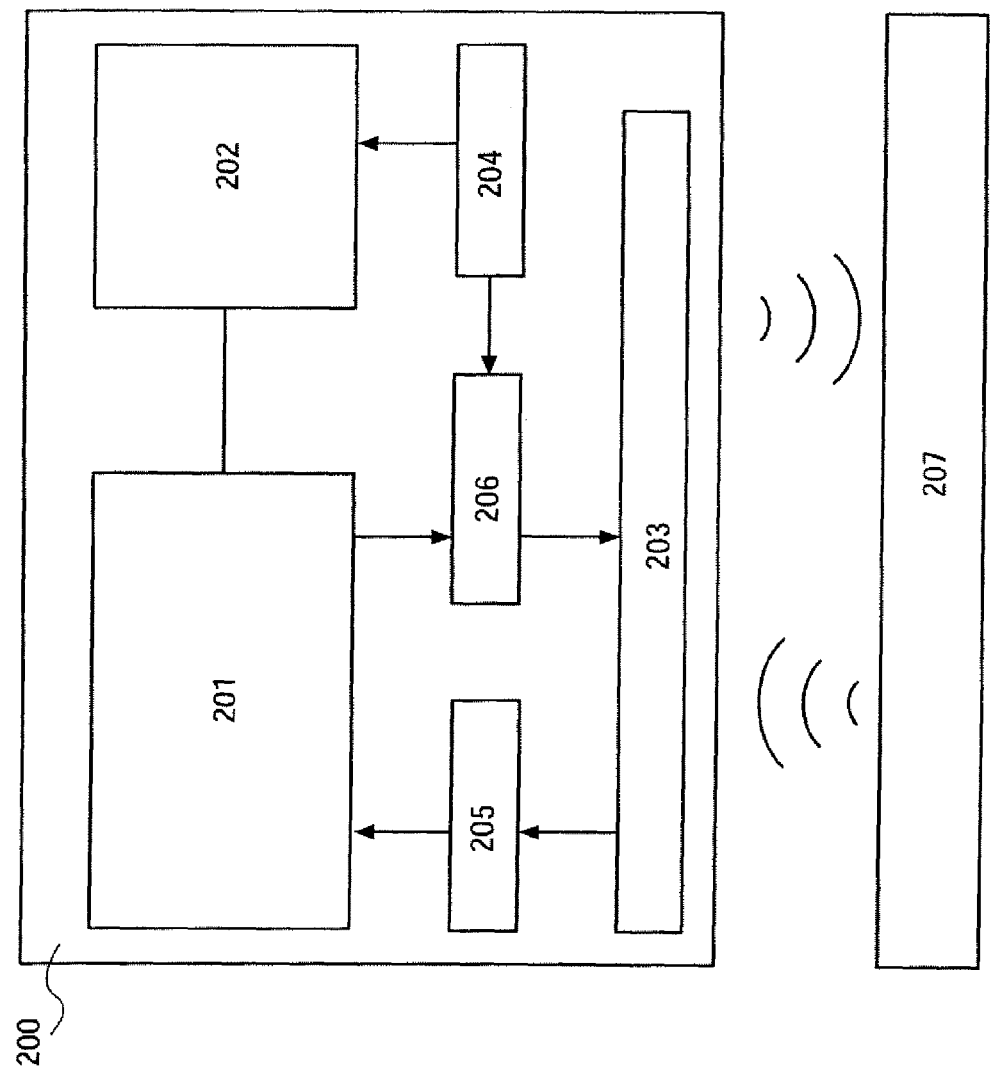
FIG. 8 shows a mode which utilizes a semiconductor device in accordance with an embodiment mode of the invention.

As shown in FIG. 8, a semiconductor device 200 of this embodiment mode which is capable of wireless communication includes an arithmetic processing circuit 201, a memory circuit 202, an antenna 203, a power supply circuit 204, a demodulation circuit 205, and a modulation circuit 206. The antenna 203 and the power supply circuit 204 are necessary components of the semiconductor device 200 which is capable of wireless communication. Components other than those are provided as appropriate to suit the application of the semiconductor device 200 which is capable of wireless communication.

The arithmetic processing circuit 201 analyzes instructions, controls the memory circuit 202, outputs data which is to be transmitted to an outside to the modulating circuit 206, and so on, based on signals input from the demodulating circuit 205.

The memory circuit 202 includes a circuit which includes a memory element and a control circuit which reads and writes data. At least an individual identification number of the semiconductor device itself is stored in the memory circuit 202. The individual identification number is used to distinguish the semiconductor device from other semiconductor devices. Further, the memory circuit 202 may be formed using a memory element described in Embodiment Mode 1 or Embodiment Mode 2.

The antenna 203 converts a carrier wave supplied from a reader/writer 207 into an AC electrical signal. Further, load modulation is applied by the modulating circuit 206. The power supply circuit 204 generates a power supply voltage by using the AC electrical signal converted by the antenna 203, and supplies the power supply voltage to each circuit.

The demodulating circuit 205 demodulates the AC electrical signal converted by the antenna 203 and supplies the demodulated signal to the arithmetic processing circuit 201. The modulating circuit 206 applies load modulation to the antenna 203 based on the signal supplied from the arithmetic processing circuit 201.

The reader/writer 207 receives as a carrier wave the load modulation applied to the antenna 203. Further, the reader/writer 207 transmits the carrier wave to the semiconductor device 200 which is capable of wireless communication. Note that the carrier wave is an electromagnetic wave which the reader/writer 207 transmits and receives, and the reader/writer 207 receives the carrier wave which has been modulated by the modulating circuit 206.

Figure 9A:
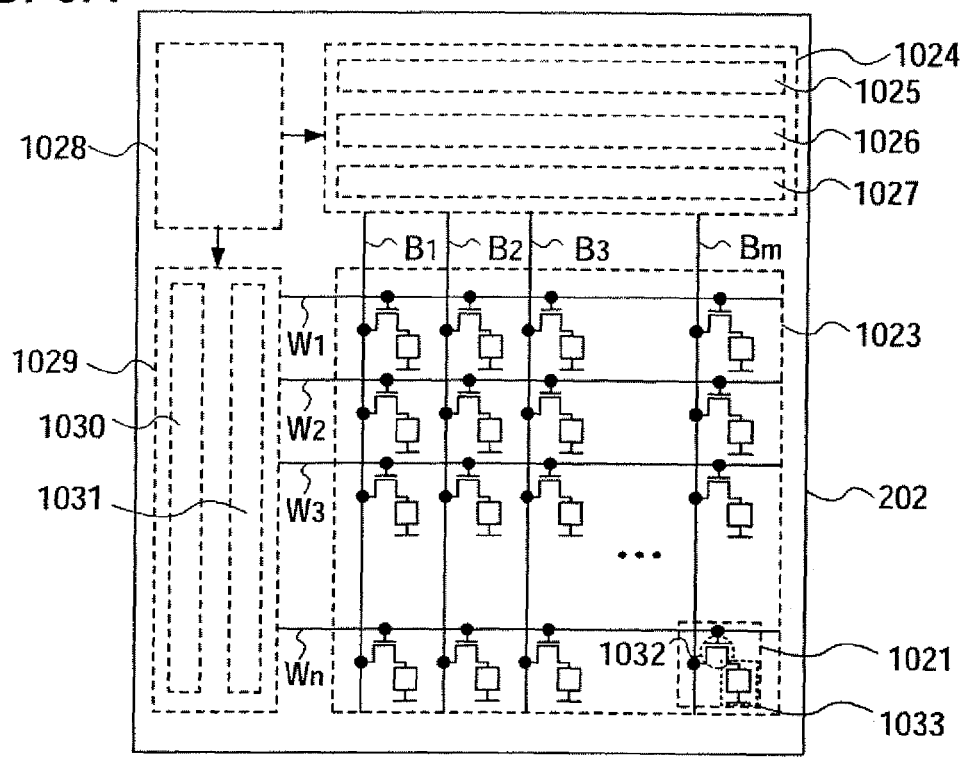
FIGS. 9A and 9B are circuit diagrams showing semiconductor devices including memory elements in accordance with an embodiment mode of the invention.
Figure 9B:
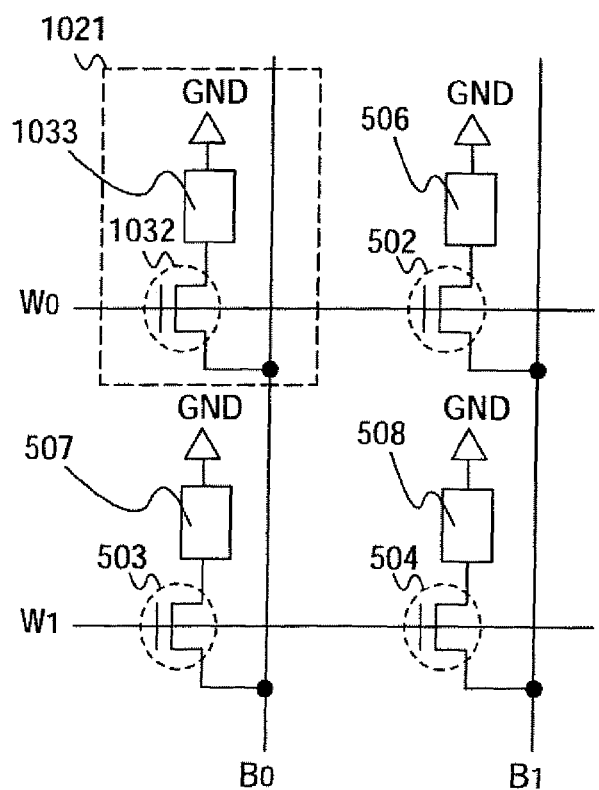

FIG. 9A shows a structure in which the memory circuit 202 includes memory elements to which the invention has been applied which are arranged in matrix form.

Note that although in FIG. 9A, memory elements of the invention have been used for all memory elements, the invention is not limited to this. Alternatively, a memory portion which utilizes a memory element of the invention and stores an individual identification number of a semiconductor device and another memory portion may be included in the memory circuit 202.

FIG. 9A shows an example of a structure of the memory circuit 202 in which memory elements of the invention are arranged in matrix form. The memory circuit 202 includes a memory cell array 1023 in which memory cells 1021 are provided in matrix form; a bit line driver circuit 1024 which includes a column decoder 1025, a reading circuit 1026, and a selector 1027; a word line driver circuit 1029 which includes a row decoder 1030 and a level shifter 1031; and an interface 1028 which includes a writing circuit and the like and communicates with an outside. Note that the structure of the memory circuit 202 described here is only an example. The memory circuit 202 may include another circuit, such as a sense amplifier, an output circuit, or a buffer; and the writing circuit may be provided in the bit line driver circuit.

The memory cell 1021 includes first wirings which form word lines $W_y$ ($1 \leq y \leq n$), second wirings which form bit lines $B_x$ ($1 \leq x \leq m$), a TFT 1032, and a memory element 1033.

Operations of writing to a memory cell of the invention and reading a memory cell of the invention will now be described with reference to FIG. 9B. Note that here, a state in which '0' has been written to the memory cell is referred to as a second state and a state in which '1' has been written to the memory cell is referred to as a first state.

First, an example of a circuit operation for writing '0' to the memory cell 1021 will be described. A writing process is performed by selecting a word line $W_0$ of the memory cell 1021 and flowing current through a bit line $B_0$. That is, the memory cell to which it is desired that writing be performed is selected by the word line $W_0$, the memory element 1033 shifts from the first state to the second state, and voltage sufficient that insulation can be caused is applied. For example, the voltage is 10 V. At this time, in order to prevent writing to other memory elements 506, 507, and 508 in the memory cell from being performed, TFTs 502, 503, and 504 are turned off. For example, the word line $W_1$ and the bit line $B_1$ are 0 V. A state where '0' is written to the memory element 1033 can be brought about by applying a voltage sufficient to shift the memory element 1033 from the first state to the second state to the bit line $B_0$ when only the word line $W_0$ is selected.

An example of a reading operation of the memory cell 1021 will now be described. In a reading operation, it is determined whether the memory cell 1021 is in the first state, in which '1' is written to the memory element 1033, or the second state, in which '0' is written to the memory element 1033. For example, the case will now be described where it is read whether the memory cell 1021 is in the state in which '0' is written to the memory cell 1021, or the state in which '1' is written to the memory cell 1021. The memory element 1033 is in the state in which '0' has been written to the memory element 1033; that is, the memory element 1033 is insulated. The word line $W_0$ is selected and the TFT 1032 is turned on. Here, while the TFT 1032 is in an 'on' state, a voltage which is greater than or equal to a predetermined voltage is applied to the bit line $B_0$. Here, the predetermined voltage is 5 V. At this time, if the memory element 1033 is in the first state; that is, if the memory element 1033 is not insulated, current flows to a wiring which is grounded in the memory cell 1021, and voltage of the bit line $B_0$ becomes 0 V. Conversely, if the memory element 1033 is in the second state; that is, if the memory element 1033 is insulated, current does not flow to the wiring which is grounded in the memory cell 1021, and the voltage of the bit line $B_0$ is maintained at 5 V. Thus, whether '0' is written or '1' is written can be determined by the voltage of the bit line.

Thus, a memory element of the invention can be applied to a semiconductor device which is capable of wireless communication.

[Embodiment Mode 4]

Figure 10A:
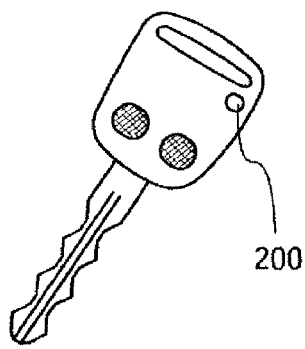
FIGS. 10A to 10F show examples which include a semiconductor device in accordance with an embodiment mode of the invention.
Figure 10B:
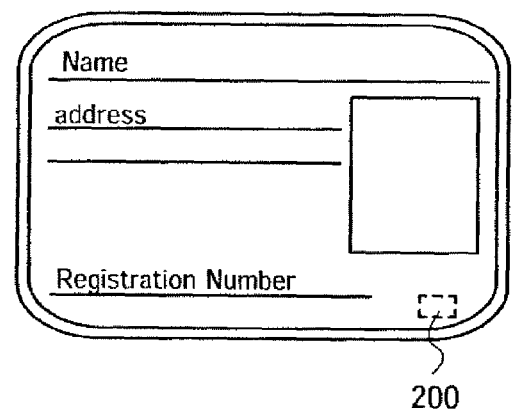
Figure 10C:
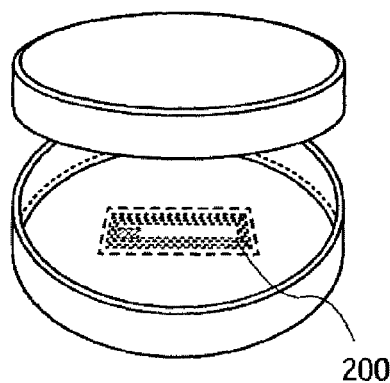
Figure 10D:
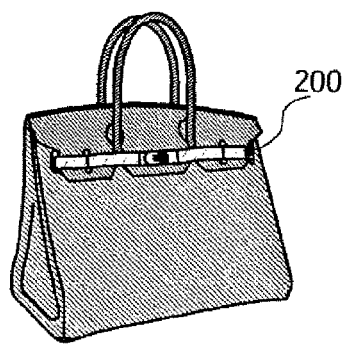
Figure 10E:
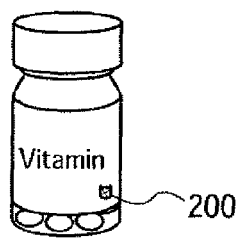
Figure 10F:
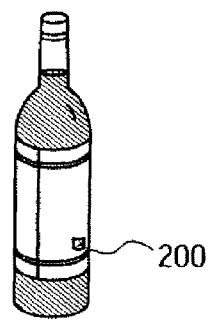

The semiconductor device 200, which is capable of wireless communication, fabricated based on Embodiment Mode 3 can be used for a variety of items and systems by utilizing its function of transmitting and receiving electromagnetic waves. Examples of items to which the semiconductor device 200 which is capable of wireless communication can be applied are keys (see FIG. 10A), paper money, coins, securities, bearer bonds, documents (e.g., driver's licenses or resident's cards; see FIG. 10B), books, containers (e.g., petri dishes; see FIG. 10C), packaging containers (e.g., wrapping paper or bottles; see FIGS. 10E and 10F), recording media (e.g., disks or video tapes), means of transportation (e.g., bicycles), personal accessories (e.g., shoes or eyeglasses; see FIG. 10D), food, clothing, everyday articles, electronic appliances (e.g., liquid crystal display devices, EL display devices, television devices, and portable terminals), or the like.

The semiconductor device 200, which is capable of wireless communication, fabricated by applying the invention is fixed to items of a variety of forms, such as those above, by being attached to or embedded in a surface. Further, a system refers to a goods management system, a system having an authentication function, a distribution system, or the like. By using a semiconductor device of the invention, a system can be made more sophisticated and multifunctional and can have higher added value.

[Embodiment Mode 5]

Figure 13:
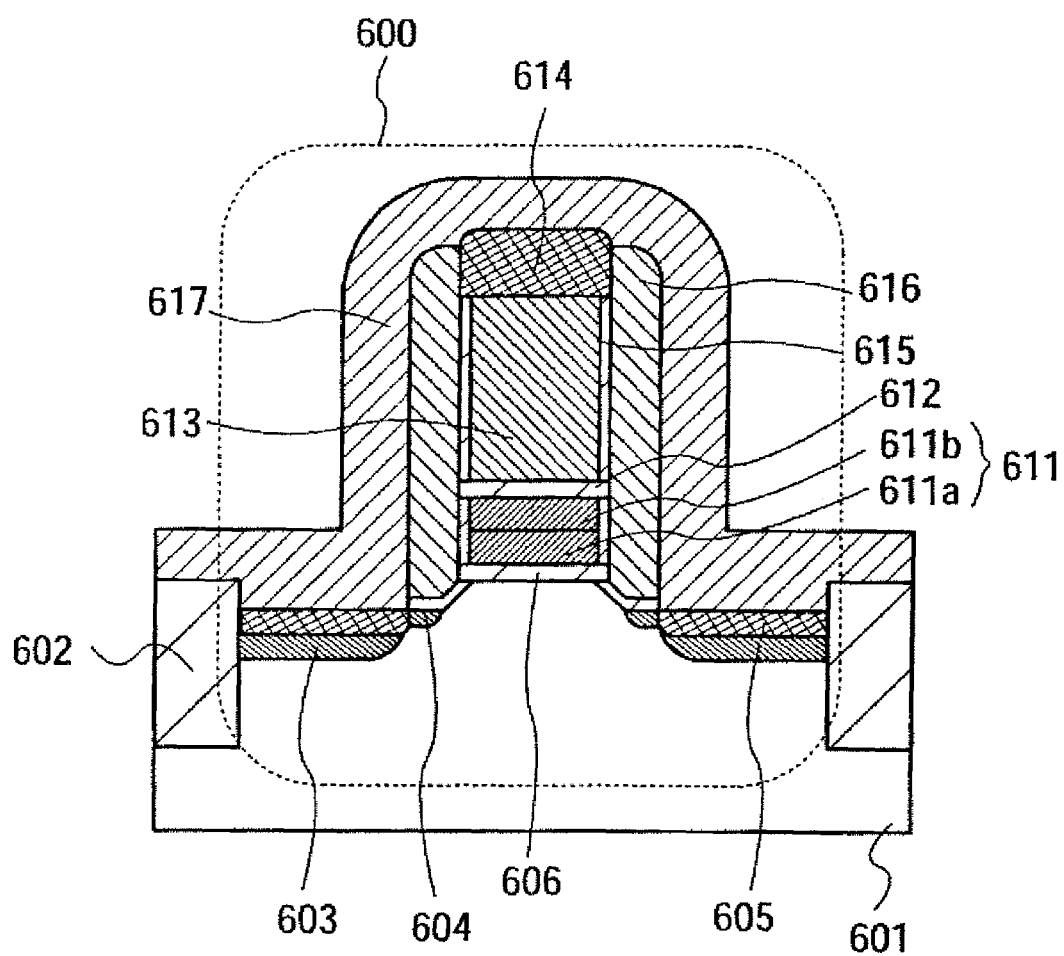
FIG. 13 is a cross-sectional view of a nonvolatile memory transistor in accordance with an embodiment mode of the invention.

This embodiment mode relates to a nonvolatile semiconductor memory device which includes a so-called floating gate memory transistor. FIG. 13 shows a cross-sectional structure of a nonvolatile memory transistor of this embodiment mode.

A nonvolatile memory transistor in FIG. 13 is fabricated using a p-type semiconductor substrate, for example. Alternatively, an SOI substrate or a SIMOX substrate can be used as a substrate which can be used to form a nonvolatile memory transistor using a single crystal semiconductor layer. On a semiconductor substrate 601, element isolating insulating layers 602, having a shallow trench isolation (STI) or local oxidation of silicon (LOCOS) structure or the like, are formed as necessary. A nonvolatile memory transistor 600 is formed between the element isolating insulating layers 602.

Next, an example of a manufacturing process for the nonvolatile memory transistor 600 will be described with reference to FIGS. 14A to 14C, 15A and 15B, 16A and 16B, 17A and 17B, 18A and 18B, and 23A to 23C.

Figure 23A:
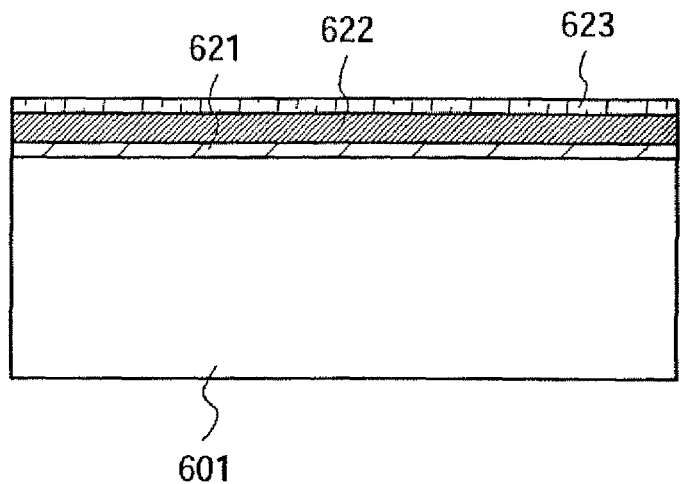
FIGS. 23A to 23C are cross-sectional views of manufacturing steps of a nonvolatile memory transistor in accordance with an embodiment mode of the invention.

First, as shown in FIG. 23A, a first insulating layer 621, a conductive layer 622 which serves as material for a first gate electrode, and a protective layer 623 are formed consecutively over the semiconductor substrate 601. When the first insulating layer 621 and the conductive layer 622 are formed consecutively, interfaces of an active layer, a gate insulating film, and a gate electrode which are formed subsequently can be maintained in a favorable state. As the semiconductor substrate 601, a p-type semiconductor substrate is used, as mentioned above; and as the first insulating layer 621, a silicon oxide layer is formed, for example. In the case of using a silicon oxide layer as the first insulating layer 621, the silicon oxide layer may be formed by oxidizing a surface of the semiconductor substrate 601 or by forming a silicon oxide layer by CVD or the like.

Further, as the conductive layer 622 which serves as material for a first gate electrode, a polycrystalline semiconductor layer which contains a noble gas element and is formed by sputtering; for example, a polycrystalline silicon layer which contains argon (Ar); may be used. Alternatively, a polycrystalline silicon layer formed by sputtering or CVD may be used as the conductive layer 622. An impurity element which imparts one conductivity type is added to the polycrystalline semiconductor layer which is formed as the conductive layer 622 while or after forming the polycrystalline semiconductor layer.

Silicon nitride, for example, is used to form the protective layer 623.

Figure 23B:
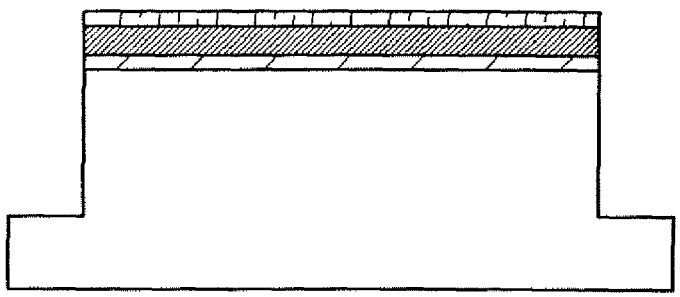
Figure 23C:
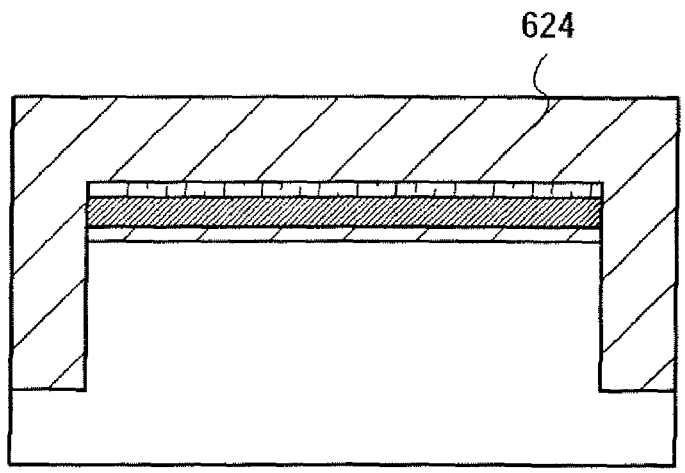

Next, as shown in FIG. 23B, end portions of a stacked structure in which the semiconductor substrate 601, the first insulating layer 621, the conductive layer 622, and the protective layer 623 are stacked are etched to form trench openings for element isolation.

Then, an insulating film 624 is formed over the trench openings and the protective layer 623. As the insulating film 624, a silicon oxide film, a silicon oxide film which contains nitrogen, or the like may be used, for example. In this embodiment mode, a silicon oxide film formed by CVD is used as the insulating film 624 (refer to FIG. 23C).

Next, planarization is performed by polishing from a surface of the insulating film 624 using chemical mechanical polishing (CMP). Further, the protective layer 623 is removed by etching (refer to FIG. 14A). By removing the protective layer 623, the conductive film 622 is exposed.

A conductive layer 626 formed of the same material as the conductive layer 622 is formed over the conductive layer 622. Further, a second insulating layer 627, a conductive layer 628 which serves as material for a second gate electrode, and an insulating film 629 are formed.

As the second insulating layer 627, a silicon oxide layer, a silicon nitride layer, a silicon nitride layer which contains oxygen, a silicon oxide layer which contains nitrogen, or the like may be used. In this embodiment mode, a silicon oxide layer is used as the second insulating layer 627.

As the conductive layer 628, a polycrystalline semiconductor layer may be used. Further, similarly to the conductive layer 622, a noble gas element may be included in the conductive layer 628. In this embodiment mode, a polycrystalline silicon layer which contains argon (Ar) and is formed by sputtering is used as the conductive layer 628.

The insulating film 629 serves as a hard mask in a subsequent process step. As the insulating film 629, a silicon oxide film, a silicon nitride film, a silicon nitride film which contains oxygen, a silicon oxide film which contains nitrogen, or the like may be used. In this embodiment mode, a silicon oxide film is used as the insulating film 629.

Figure 14A:
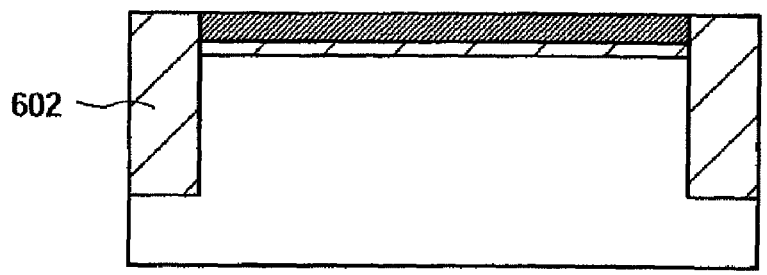
FIGS. 14A to 14C are cross-sectional views of manufacturing steps of a nonvolatile memory transistor in accordance with an embodiment mode of the invention.
Figure 14B:
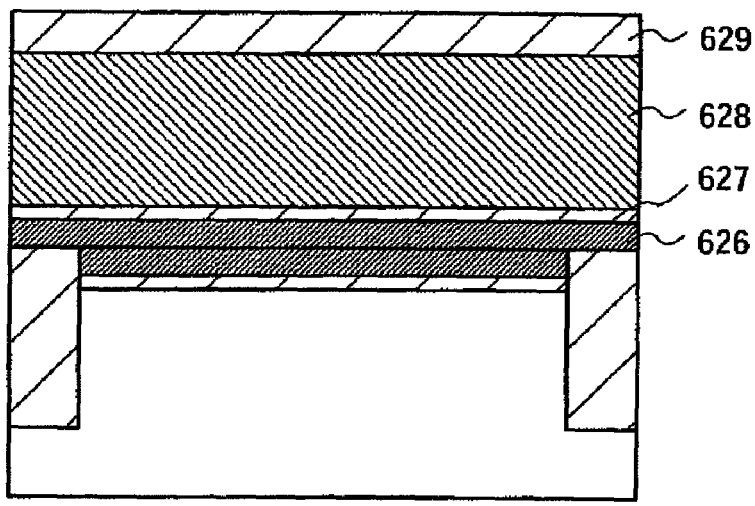
Figure 14C:
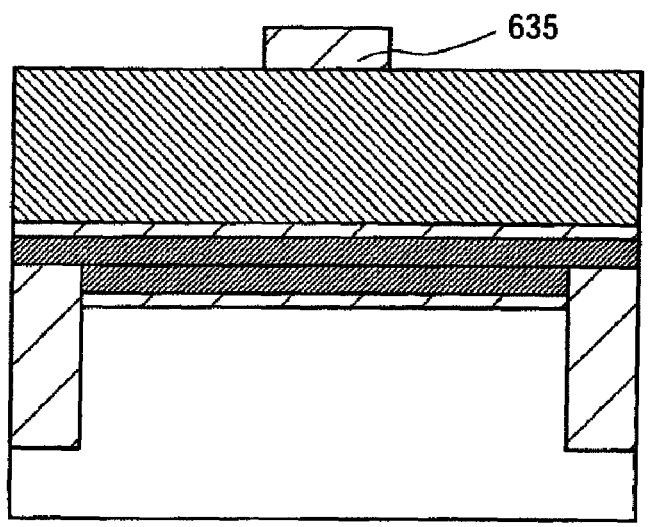

When components up to and including those in FIG. 14B have been formed, a resist is formed over the insulating film 629; the resist is used in etching the insulating film 629 to form a hard mask 635; and the resist is then removed (refer to FIG. 14C).

Figure 15A:
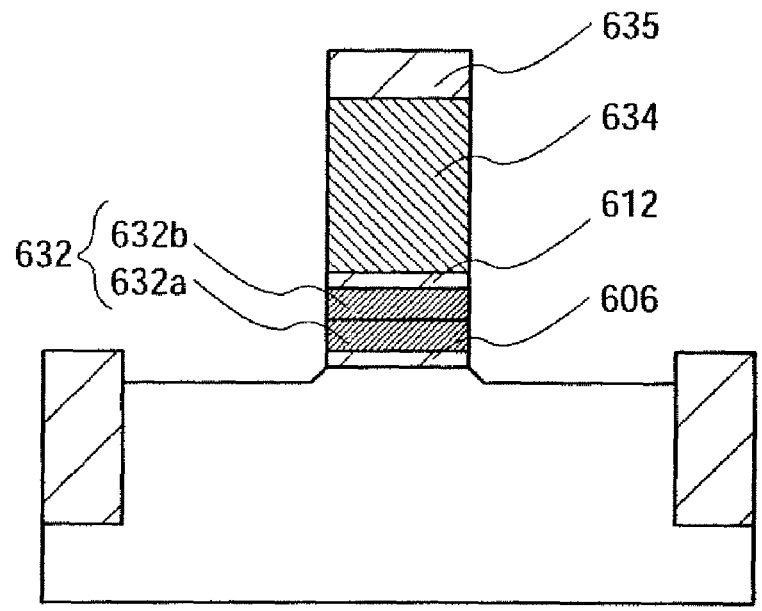
FIGS. 15A and 15B are cross-sectional views of manufacturing steps of a nonvolatile memory transistor in accordance with an embodiment mode of the invention.
Figure 15B:
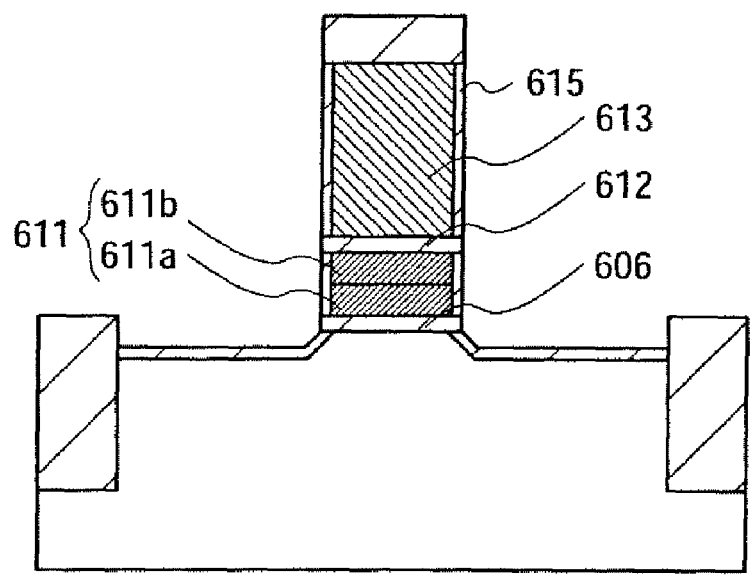

Using the hard mask 635 as a mask, the conductive layer 628, the second insulating layer 627, the conductive layer 626, the conductive layer 622, the first insulating layer 621, and the semiconductor substrate 601 are etched to form a first gate insulating layer 606, a lower layer electrode 632a of a first gate electrode 632, an upper layer electrode 632b of the first gate electrode 632, a second gate insulating layer 612, and a second gate electrode 634 (refer to FIG. 15A). The first gate electrode 632 serves as a floating gate.

Next, the entire structure is heated at a temperature of from 700° C. to 1100° C., for example, to thermally oxidize an exposed surface. Thus, end portions of the first gate electrode 632 and end portions of the second gate electrode 634 are thermally oxidized, and an insulating film 615 formed of a semiconductor oxide film is formed (refer to FIG. 15B). The end portions of the lower layer electrode 632a and the upper layer electrode 632b of the first gate electrode 632 are oxidized; and widths of the lower layer electrode 632a and the upper layer electrode 632b of the first gate electrode 632 decrease by an amount that corresponds to the sum of widths of portions of the insulating film 615. Thus, the lower layer electrode 632a and the upper layer electrode 632b of the first gate electrode 632 become a lower layer electrode 611a and an upper layer electrode 611b, respectively, of a first gate electrode 611. Similarly, end portions of the second gate electrode 634 are oxidized, and a width of the second gate electrode 634 decreases by an amount that corresponds to the sum of widths of portions of the insulating film 615. Thus, the second gate electrode 634 becomes a second gate electrode 613. The second gate electrode 613 serves as a control gate.

Note that although the insulating film 615 is formed using thermal oxidation in this embodiment mode, a thermal oxidation process step is not necessarily used. As an alternative to using thermal oxidation, an insulating film which covers the gate insulating layers and the gate electrodes may be formed using CVD or the like. In that case, the widths of the gate electrodes are not decreased.

Figure 16A:
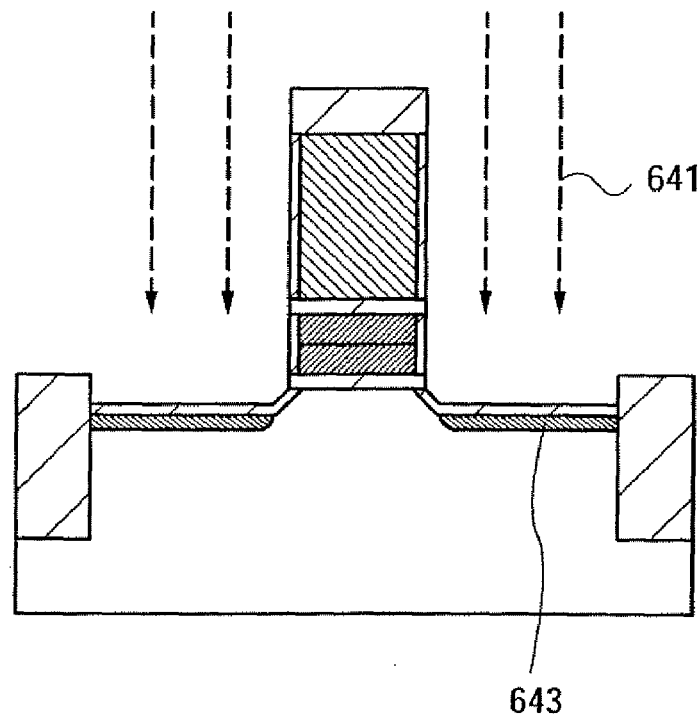
FIGS. 16A and 16B are cross-sectional views of manufacturing steps of a nonvolatile memory transistor in accordance with an embodiment mode of the invention.

Next, using the gate insulating layers and the gate electrodes as a mask, an impurity element 641 which imparts one conductivity type is added to the semiconductor substrate 601 and an extension region 643 is formed (refer to FIG. 16A). In this embodiment mode, in the case of forming a p-FET, boron (B) is added using ion implantation; and in the case of forming an n-FET, arsenic (As) or phosphorus (P) is added using ion implantation. The impurity element is added such that the concentration of the impurity element in the extension region 643 is higher than the concentration in a so-called lightly-doped drain (LDD) region. Further, the extension region 643 is formed such that a depth of the extension region 643 is less than that of source and drain regions formed in a subsequent process step. For example, to form a p-FET, boron is introduced by implanting $BF_2$ using an applied voltage of 15 keV and a dose of $3.0 \times 10^{13}/cm^2$. Further, to form an n-FET, arsenic is introduced by implanting As using an applied voltage of 15 keV and a dose of $2.0 \times 10^{14}/cm^2$.

Figure 16B:
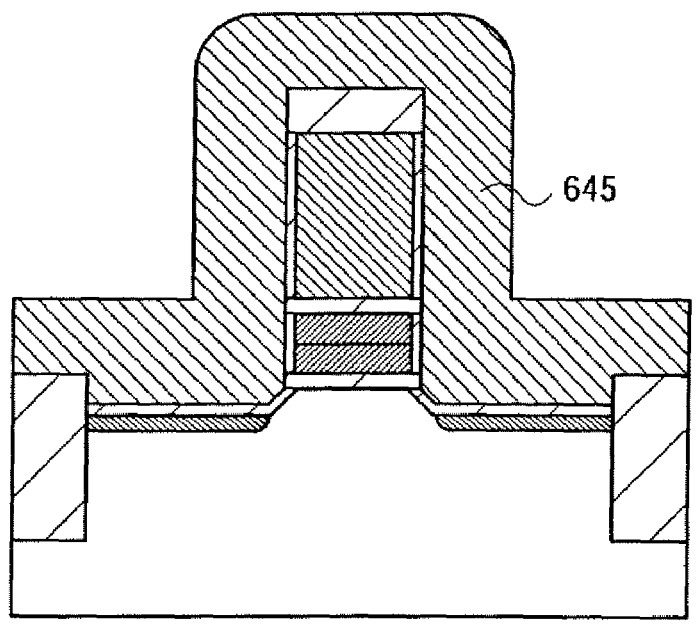

Then, an insulating film 645 is formed such that it covers the insulating film 615 (refer to FIG. 16B). As the insulating film 645, a silicon oxide film, a silicon nitride film, a silicon oxide film which contains nitrogen, a silicon nitride film which contains oxygen, or the like can be used. In this embodiment mode, a silicon nitride film is used as the insulating film 645.

Figure 17A:
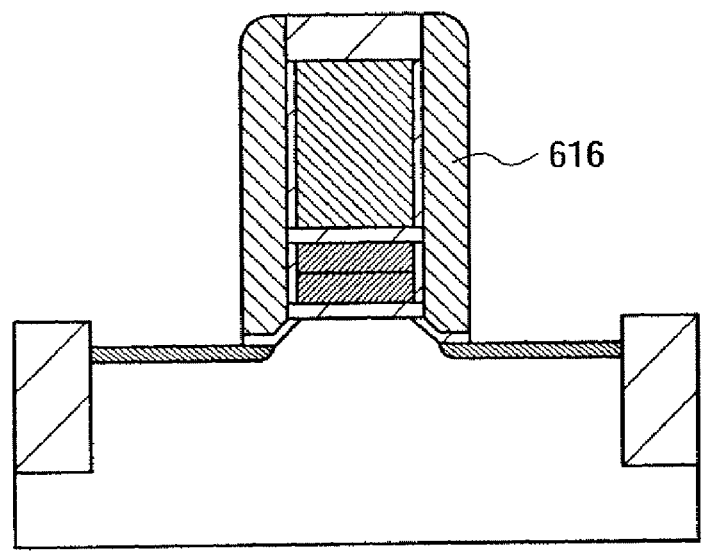
FIGS. 17A and 17B are cross-sectional views of manufacturing steps of a nonvolatile memory transistor in accordance with an embodiment mode of the invention.

The formed insulating film 645 shown in FIG. 16B is anisotropically etched to form sidewalls 616 (refer to FIG. 17A). In the anisotropic etching, the insulating film 615 serves as an etching stopper.

Figure 17B:
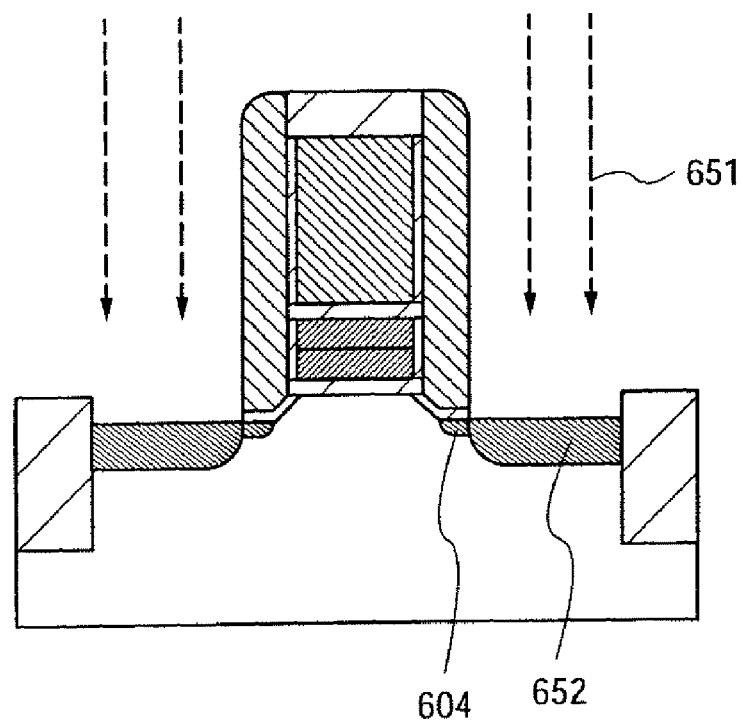
Figure 18A:
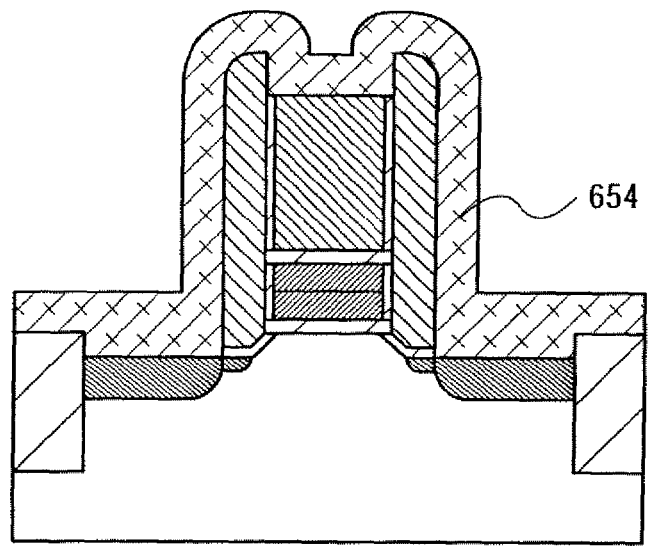
FIGS. 18A and 18B are cross-sectional views of manufacturing steps of a nonvolatile memory transistor in accordance with an embodiment mode of the invention.
Figure 18B:
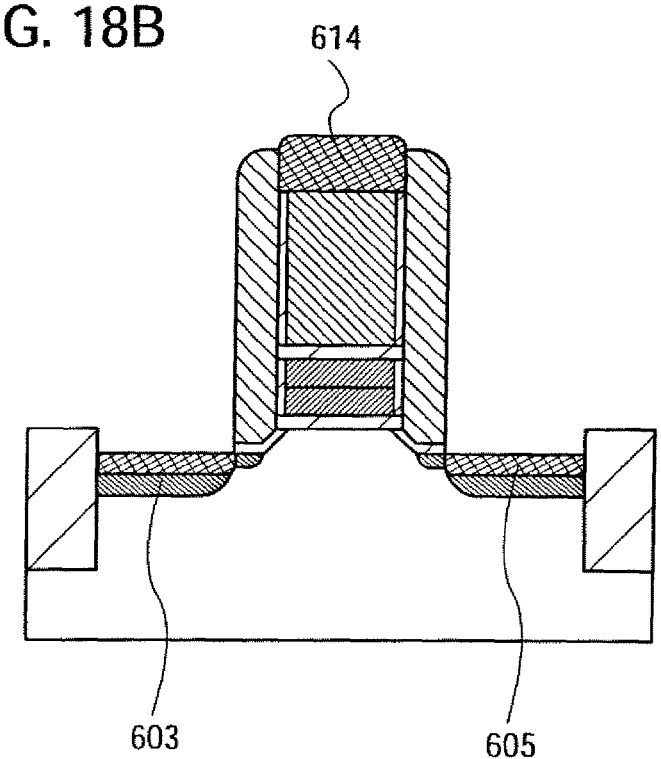

Then, using the gate electrodes and the sidewalls 616 as a mask, once again an impurity element which imparts one conductivity type; in this case, an impurity element 651 which imparts one conductivity type; is added to the semiconductor substrate 601 (refer to FIG. 17B). Thus, regions 652 which are each a source or drain region are formed, and of the extension region 643, only regions 604 are left In this embodiment mode, in the case of forming a p-FET, boron is introduced by using ion implantation to implant $BF_2$, using an applied voltage of 30 keV and a dose of $3.0 \times 10^{15}/cm^2$. Further, in the case of forming an n-FET, arsenic is introduced by using ion implantation to implant As, using an applied voltage of 50 keV and a dose of $5.0 \times 10^{15}/cm^2$.

Compared to when the extension region 643 is formed, when the impurity addition for forming the regions 652 which are each a source or drain region is performed, applied voltage is made higher and the impurity is added to a greater depth in a film thickness direction. Further, the dose is larger than when the extension region 643 is formed, so that the impurity concentration in the regions 652 which are each a source or drain region is higher.

Next, the hard mask 635 is removed. Further, a metal film 654 is formed such that it covers the sidewalls 616, the second gate electrode 613, and the semiconductor substrate 601 (refer to FIG. 18A). The metal film 654 may be formed using nickel (Ni), tungsten (W), titanium (Ti), cobalt (Co), or the like. In this embodiment mode, a cobalt film is used as the metal film 654.

After the metal film 654 is formed, a heating process step is performed, and metal silicide regions are formed in regions where the semiconductor substrate 601 and the metal film 654 are in contact and in a region where the second gate electrode 613 and the metal film 654 are in contact. In this embodiment mode, silicide regions 605 are formed in upper layers of the regions 652 which are each a source or drain region. Further, an upper layer of the second gate electrode 613 becomes a silicide region 614.

Silicide is not formed in regions 603 which are lower layers of the regions 652 which are each a source or drain region.

Further, a passivation film 617 is formed such that it covers the entire structure. As the passivation film 617, a silicon nitride film may be used, or a stacked layer which includes a silicon nitride film and a silicon oxide film may be used, for example.

Thus, the nonvolatile memory transistor 600 shown in FIG. 13 is formed.

Next, a mode of a nonvolatile semiconductor memory device which employs the nonvolatile memory transistor of this embodiment mode will be described.

Figure 19:
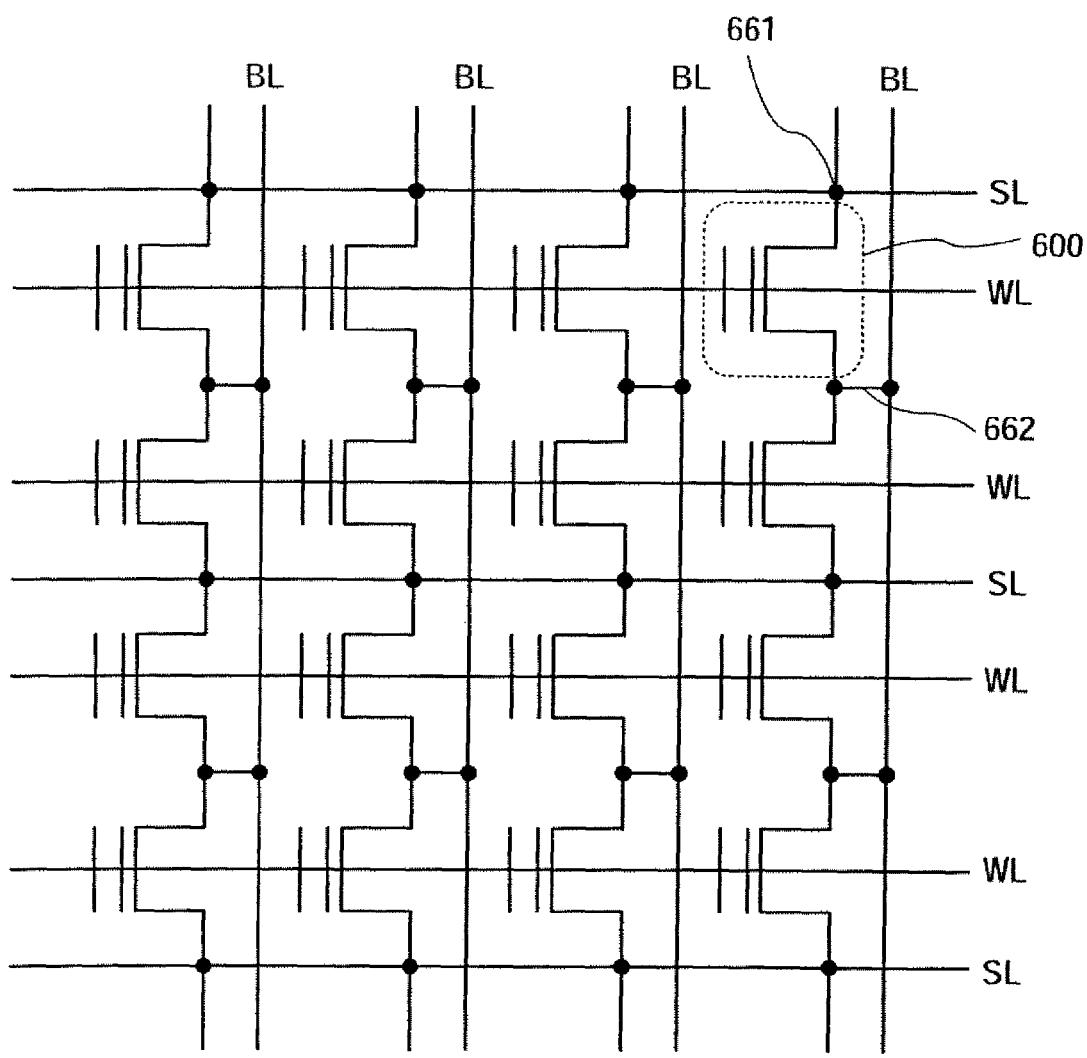
FIG. 19 is an equivalent circuit schematic of a NOR nonvolatile semiconductor memory device in accordance with an embodiment mode of the invention.

FIG. 19 shows an equivalent circuit of a NOR nonvolatile semiconductor memory device. The NOR nonvolatile semiconductor memory device includes a nonvolatile memory transistor 600, bit lines BL, source lines SL, and word lines WL. The nonvolatile memory transistor 600 is electrically connected to the source line SL through a source contact 661, and to the bit line BL through a drain contact 662.

Figure 20:
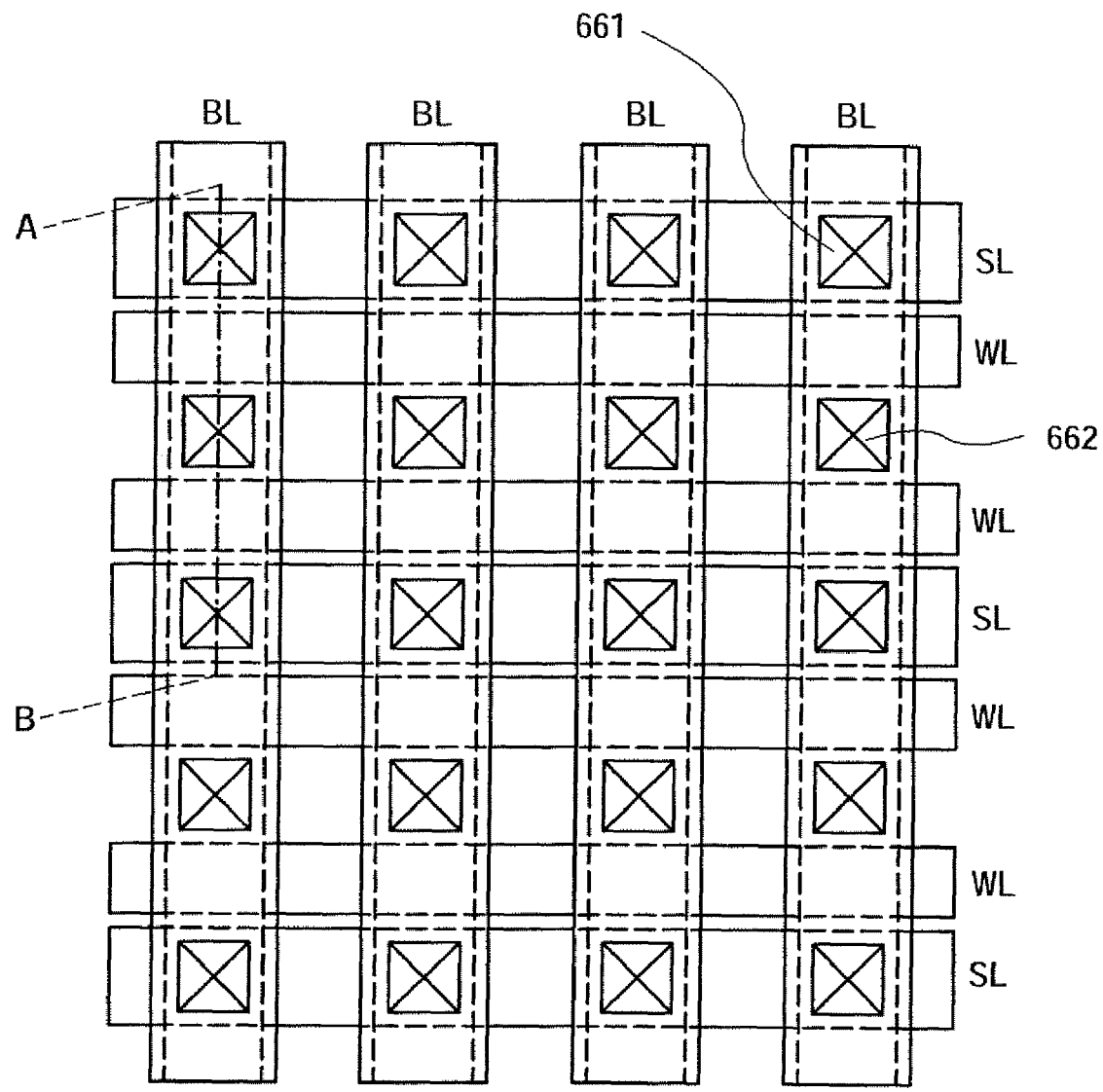
FIG. 20 shows a layout of a NOR nonvolatile semiconductor memory device in accordance with an embodiment mode of the invention.

FIG. 20 shows a layout of the NOR nonvolatile semiconductor memory device which corresponds to the equivalent circuit in FIG. 19.

Figure 21:
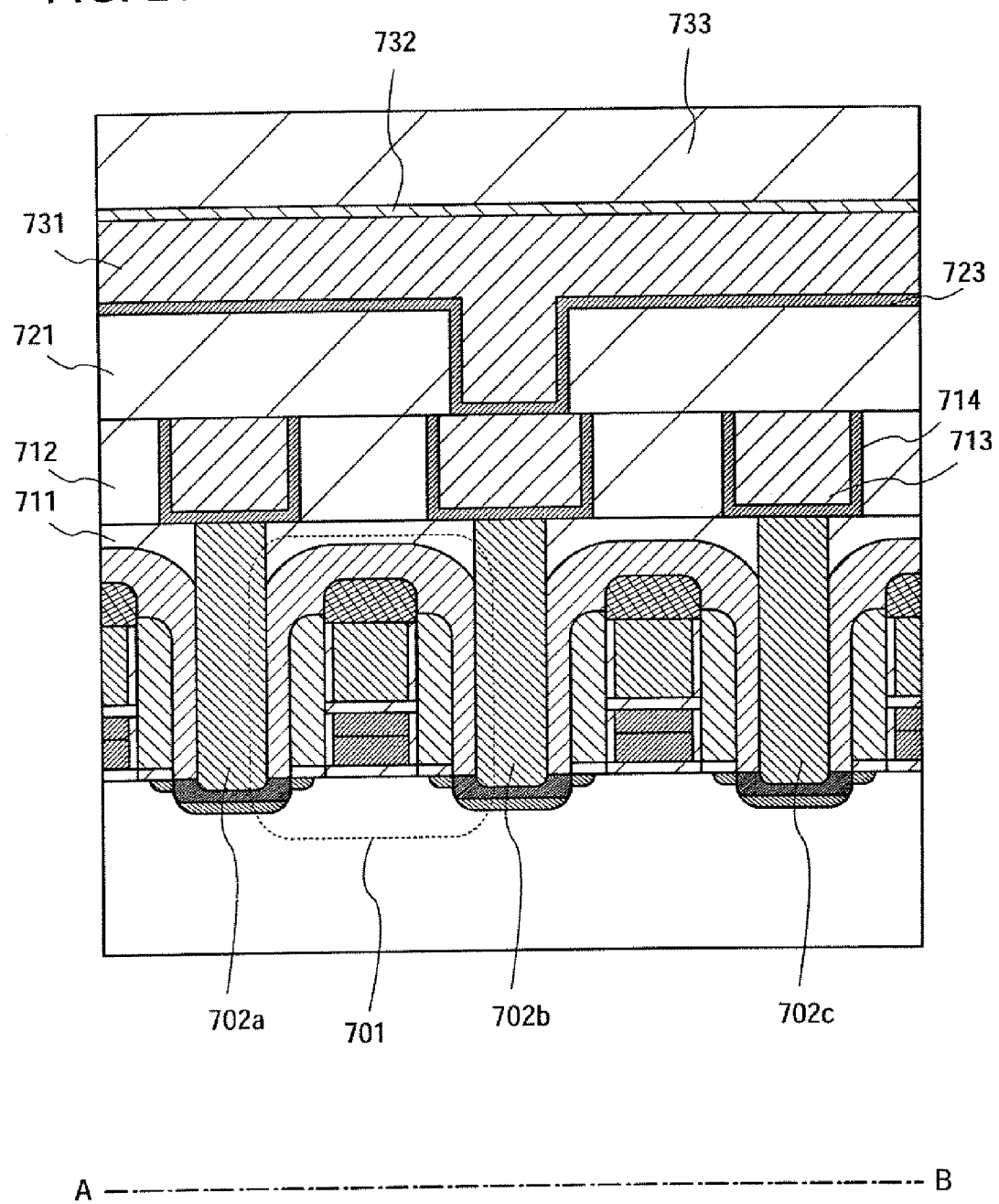
FIG. 21 shows a cross-sectional structure of a NOR nonvolatile semiconductor memory device in accordance with an embodiment mode of the invention.

FIG. 21 shows a cross-sectional structure of the NOR nonvolatile semiconductor memory device which corresponds to a cross-section taken along the cutting-plane line A-B in FIG. 20. Nonvolatile memory transistors 701 are formed adjacent to each other and have a similar structure to that of the nonvolatile memory transistor 600. Between the adjacent nonvolatile memory transistors 701, tungsten plugs 702 (702a, 702b, 702c, and so on) formed using tungsten (W) by CVD are provided.

The tungsten plug 702a corresponds to the source contact 661 in FIG. 20, and the tungsten plug 702b corresponds to the drain contact 662 in FIG. 20.

An insulating film 711 is formed over the nonvolatile memory transistors 701; and over the insulating film 711, an insulating film 712, source lines 713 (the source lines SL in FIG. 20), and a conductive film 714 which serves as a barrier metal for the source lines 713 are formed. In this embodiment mode, copper (Cu) is used for the source lines 713 and tantalum nitride is used for the conductive film 714. Note that the conductive film 714 does not have to be formed if it is not necessary.

The source lines 713 and the conductive film 714 are electrically connected to the tungsten plugs 702.

An insulating film 721 is formed over the insulating films 712, the source lines 713, and the conductive film 714. Further, over the insulating film 721, bit lines 731 (the bit lines BL in FIG. 20) and a conductive film 723 which serves as a barrier metal for the bit lines 731 are formed.

Through a contact hole in the insulating film 721, the bit line 731 and the conductive film 723 are electrically connected to the source line 713 and the conductive film 714, which are electrically connected to the tungsten plug 702b.

In this embodiment mode, the bit lines 731 are formed using copper (Cu) and the conductive film 723 is formed using tantalum nitride.

Further, a passivation film 732 is formed such that it covers the bit lines 731. In this embodiment mode, the passivation film 732 is formed using silicon nitride.

An insulating film 733 is formed over the passivation film 732. The insulating film 733, the insulating film 721, the insulating film 712, and the insulating film 711 may be formed using the same material. The material can be an inorganic insulating material or an organic insulating material. For example, the insulating film 733, the insulating film 721, the insulating film 712, and the insulating film 711 may each be formed using a silicon oxide film which contain nitrogen. Alternatively, each insulating film may be formed using different insulating materials, instead of the same material.

Figure 22:
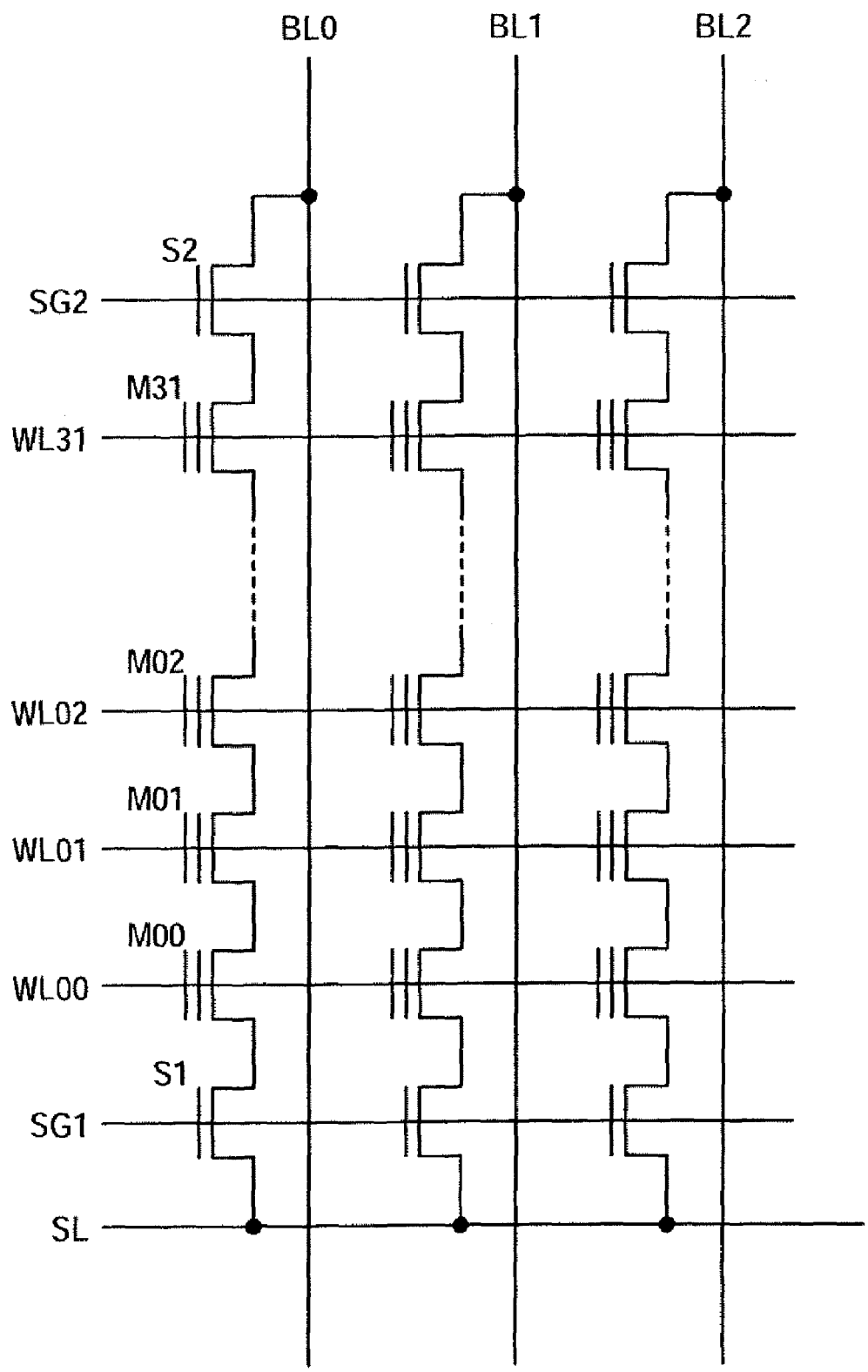
FIG. 22 is an equivalent circuit schematic of a NAND nonvolatile semiconductor memory device.

Further, when the nonvolatile memory transistor of this embodiment mode is used, a NAND nonvolatile semiconductor memory device such as that shown in FIG. 22 can be formed.

The NAND nonvolatile semiconductor memory device in FIG. 22 includes bit lines BL0, BL1, BL2, and so on; select transistors S1, S2, and so on; a source line SL; select gate lines SG1, SG2, and so on; word lines WL00, WL01, WL02, WL31, and so on; and memory cells M00, M01, M02, M31, and so on.

[Embodiment 1]

This embodiment will be described with reference to FIGS. 11A, 11B, and 12.

Figure 12:
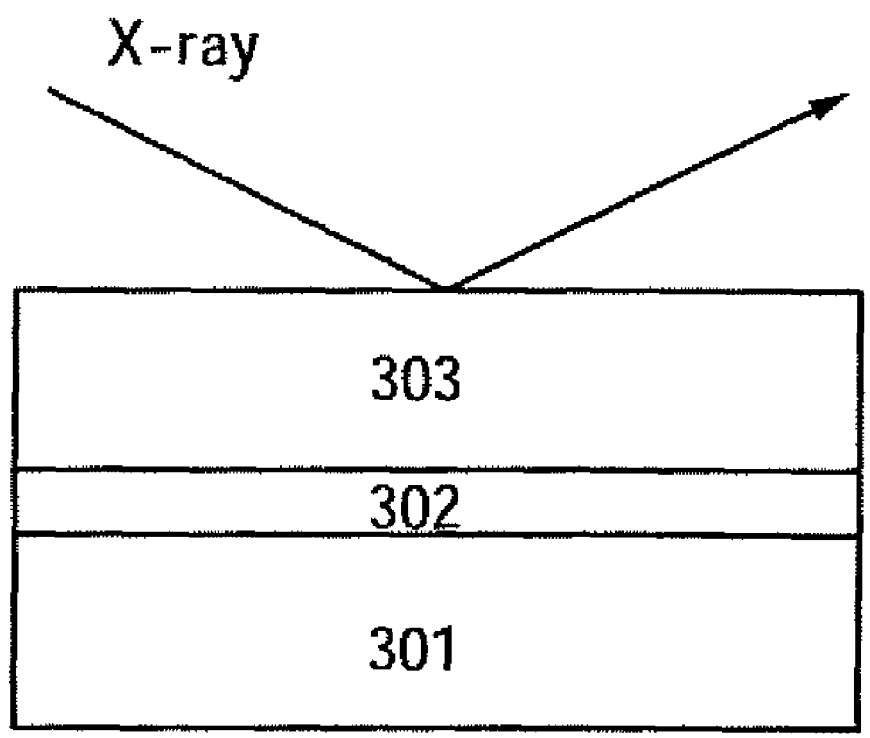
FIG. 12 shows a stacked structure used in an experiment in Embodiment 1.

FIG. 12 shows a stacked structure used in this embodiment. Over a substrate 301, a base insulating film 302 and a semiconductor film 303 are formed. For the semiconductor film 303, an amorphous silicon film is formed, and then a metallic element that promotes crystallization; which in this embodiment is nickel (Ni); is added, and heating is performed to crystallize the film. Further, the crystallized silicon film is irradiated using a laser, and the obtained crystalline silicon film is used as the semiconductor film 303.

Figure 11A:
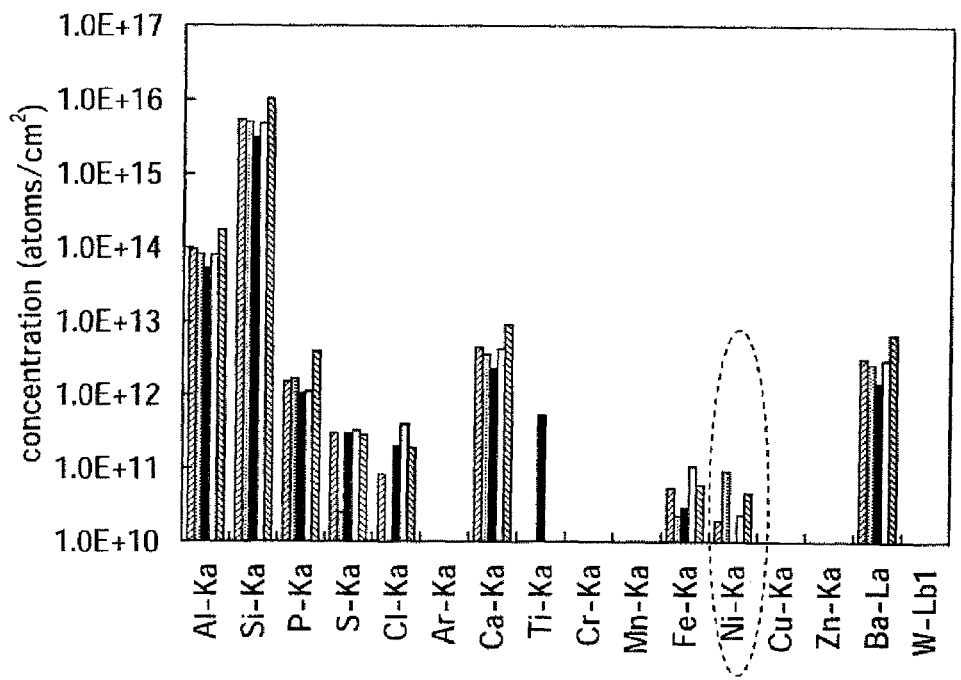
FIGS. 11A and 11B show experimental results of Embodiment 1.

FIG. 11A shows results of measurements conducted on the following structure using total reflection X-ray fluorescence spectroscopy (TXRF). An amorphous silicon film is formed over the semiconductor film 303 by sputtering. When an amorphous silicon film is formed by sputtering, argon mixes in with the silicon, and therefore, an amorphous silicon film which contains argon is formed. The nickel element in the semiconductor film 303 is gettered into the amorphous silicon film, and then the amorphous silicon film over the semiconductor film 303 is removed. FIG. 11A shows results for when a surface of the semiconductor film 303 was measured using total reflection X-ray fluorescence spectroscopy (TXRF). Meanwhile, FIG. 11B shows results for when the surface of the semiconductor film 303 was measured using TXRF in the case where an amorphous silicon film is not formed over the semiconductor film 303. In the case where an amorphous silicon film is not formed over the semiconductor film 303, because gettering is not performed, the nickel is not removed from the semiconductor film 303. Note that basically, one substrate was measured five times, so measurement results for five times (a bar graph containing five bars) were obtained for each element; however, sometimes results are undetectable or there are errors in the results, so the number of bars for each element is not necessarily five.

Figure 11B:
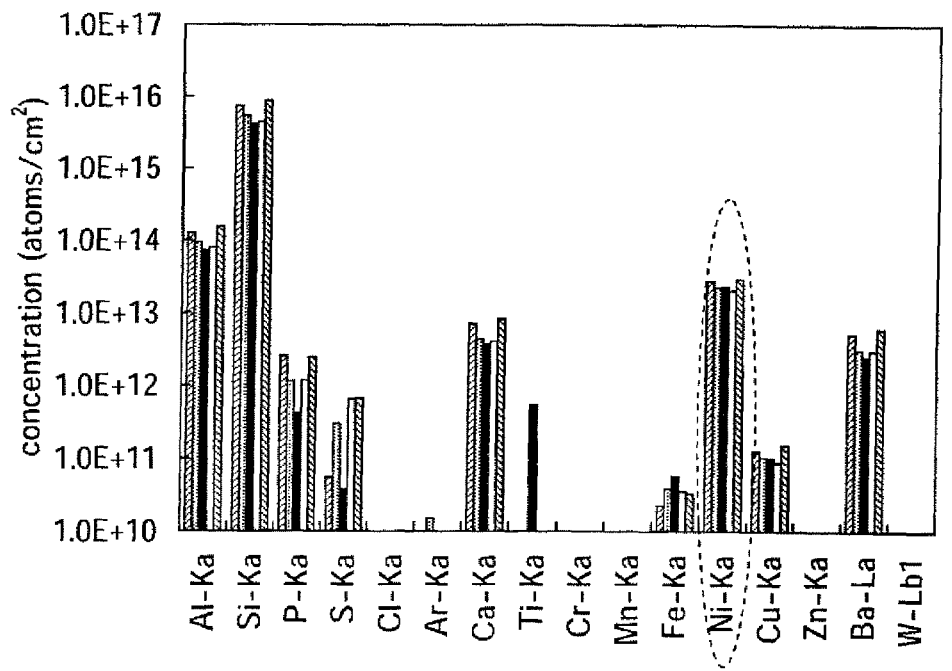

Comparing FIG. 11A with FIG. 11B, it can clearly be seen that the nickel concentration is lower in FIG. 11A. Therefore, it can be considered that the nickel in the semiconductor film 303 is nickel which was gettered into the amorphous silicon formed over the semiconductor film 303. Meanwhile, the nickel concentration in FIG. 11B is higher than that in FIG. 11A, and thus it can be seen that gettering did not take place.

Therefore, it can be seen that when a semiconductor film which contains a noble gas element is used to form a floating gate in a flash memory, even if there is a metallic element (e.g., nickel) in an active layer, the metallic element will be absorbed by the floating gate, as mentioned in Embodiment Modes 1 to 3.

This application is based on Japanese Patent Application serial no. 2007-070421 filed with Japan Patent Office on Mar. 19, 2007, the entire contents of which are hereby incorporated by reference.

What is claimed is:

1. A semiconductor device comprising a memory element, the memory element comprising:
   a first semiconductor comprising a source region, a drain region, and a channel forming region which is provided between the source region and the drain region;
   a first insulating layer over the first semiconductor;
   a first gate electrode over the first insulating layer;
   a second insulating layer over the first gate electrode; and
   a second gate electrode over the second insulating layer,
   wherein at least one of the source region and the drain region comprises a metal element, and
   wherein the first gate electrode comprises a second semiconductor containing a noble gas element.

2. A semiconductor device comprising a memory element, the memory element comprising:
   a first semiconductor comprising a source region, a drain region, and a channel forming region which is provided between the source region and the drain region;
   a first insulating layer over the first semiconductor;
   a first gate electrode over the first insulating layer;
   a second insulating layer over the first gate electrode; and
   a second gate electrode over the second insulating layer,
   wherein at least one of the source region and the drain region comprises a metal element,
   wherein the first gate electrode comprises a second semiconductor containing an impurity element which imparts one conductivity type, and
   wherein the second semiconductor contains a noble gas element.

3. A semiconductor device comprising a memory element, the memory element comprising:
   a first semiconductor comprising a source region, a drain region, and a channel forming region which is provided between the source region and the drain region;
   a first insulating layer over the first semiconductor;
   a first gate electrode over the first insulating layer;
   a second insulating layer over the first gate electrode; and
   a second gate electrode over the second insulating layer,
   wherein at least one of the source region and the drain region comprises a metal element, and
   wherein the first gate electrode comprises a second semiconductor containing an impurity element which imparts one conductivity type, and a third semiconductor containing a noble gas element.

4. The semiconductor device according to claim 1, wherein a concentration of the noble gas element in the second semiconductor is greater than or equal to $5.0 \times 10^{19}$ atoms/cm$^3$.

5. The semiconductor device according to claim 2, wherein a concentration of the noble gas element in the second semiconductor is greater than or equal to $5.0 \times 10^{19}$ atoms/cm$^3$.

6. The semiconductor device according to claim 3, wherein a concentration of the noble gas element in the third semiconductor is greater than or equal to $5.0 \times 1.0^{19}$ atoms/cm$^3$.

7. The semiconductor device according to claim 1, wherein the noble gas element is at least one selected from the group consisting of argon, krypton, and xenon.

8. The semiconductor device according to claim 2, wherein the noble gas element is at least one selected from the group consisting of argon, krypton, and xenon.

9. The semiconductor device according to claim 3, wherein the noble gas element is at least one selected from the group consisting of argon, krypton, and xenon.

10. The semiconductor device according to claim 1, wherein the metal element is at least one selected from the group consisting of nickel, cobalt, titanium, and tungsten.

11. The semiconductor device according to claim 2, wherein the metal element is at least one selected from the group consisting of nickel, cobalt, titanium, and tungsten.

12. The semiconductor device according to claim 3, wherein the metal element is at least one selected from the group consisting of nickel, cobalt, titanium, and tungsten.

13. The semiconductor device according to claim 1, wherein the second gate electrode comprises at least one selected from the group consisting of tungsten, tantalum, titanium, and aluminum.

14. The semiconductor device according to claim 2, wherein the second gate electrode comprises at least one selected from the group consisting of tungsten, tantalum, titanium, and aluminum.

15. The semiconductor device according to claim 3, wherein the second gate electrode comprises at least one selected from the group consisting of tungsten, tantalum, titanium, and aluminum.

16. The semiconductor device according to claim 1, wherein the first semiconductor is a single crystalline semiconductor.

17. The semiconductor device according to claim 2, wherein the first semiconductor is a single crystalline semiconductor.

18. The semiconductor device according to claim 3, wherein the first semiconductor is a single crystalline semiconductor.

19. The semiconductor device according to claim 1, wherein the first semiconductor is a polycrystalline semiconductor.

20. The semiconductor device according to claim 2, wherein the first semiconductor is a polycrystalline semiconductor.

21. The semiconductor device according to claim 3, wherein the first semiconductor is a polycrystalline semiconductor.

22. A semiconductor device comprising a memory element, the memory element comprising:
a first semiconductor comprising a source region, a drain region, and a channel forming region which is provided between the source region and the drain region;
a first insulating layer over the first semiconductor;
a first gate electrode over the first insulating layer;
a second insulating layer over the first gate electrode; and
a second gate electrode over the second insulating layer,
wherein at least one of the source region and the drain region comprises a metal element, and
wherein the first gate electrode comprises a second semiconductor containing a noble gas element and the metal element.

23. The semiconductor device according to claim 22, wherein a concentration of the noble gas element in the second semiconductor is greater than or equal to $5.0 \times 10^{19}$ atoms/cm$^3$.

24. The semiconductor device according to claim 22, wherein the noble gas element is at least one selected from the group consisting of argon, krypton, and xenon.

25. The semiconductor device according to claim 22, wherein the metal element is at least one selected from the group consisting of nickel, cobalt, titanium, and tungsten.

26. The semiconductor device according to claim 22, wherein the second gate electrode comprises at least one selected from the group consisting of tungsten, tantalum, titanium, and aluminum.

27. The semiconductor device according to claim 22, wherein the first semiconductor is a single crystalline semiconductor.

28. The semiconductor device according to claim 22, wherein the first semiconductor is a polycrystalline semiconductor.

29. A semiconductor device comprising a memory element, the memory element comprising:
a first semiconductor comprising a source region, a drain region, and a channel forming region which is provided between the source region and the drain region;
an insulating layer over the first semiconductor; and
a gate electrode over the insulating layer,
wherein at least one of the source region and the drain region comprises a metal element, and
wherein the gate electrode comprises a second semiconductor containing a noble gas element.

30. The semiconductor device according to claim 29, wherein a concentration of the noble gas element in the second semiconductor is greater than or equal to $5.0 \times 10^{19}$ atoms/cm$^3$.

31. The semiconductor device according to claim 29, wherein the noble gas element is at least one selected from the group consisting of argon, krypton, and xenon.

32. The semiconductor device according to claim 29, wherein the metal element is at least one selected from the group consisting of nickel, cobalt, titanium, and tungsten.

33. The semiconductor device according to claim 29, wherein the first semiconductor is a single crystalline semiconductor.

34. The semiconductor device according to claim 29, wherein the first semiconductor is a polycrystalline semiconductor.

* * * * *

UNITED STATES PATENT AND TRADEMARK OFFICE
CERTIFICATE OF CORRECTION

PATENT NO.         : 8,395,201 B2
APPLICATION NO.    : 13/288995
DATED              : March 12, 2013
INVENTOR(S)        : Kengo Akimoto Page 1 of 1

It is certified that error appears in the above-identified patent and that said Letters Patent is hereby corrected as shown below:

In the Specification:

Column 2, line 17, "suicide" should read "silicide"

Column 3, line 52, "suicide" should read "silicide"

In the Claims:

Claim 6, lines 3, "$5.0 \times 1.0^{19}$ atoms/cm$^3$" should read "$5.0 \times 10^{19}$ atoms/cm$^3$"

Signed and Sealed this
Twenty-eighth Day of May, 2013

Teresa Stanek Rea
*Acting Director of the United States Patent and Trademark Office*